US008614104B2

(12) United States Patent
Wang

(10) Patent No.: US 8,614,104 B2
(45) Date of Patent: Dec. 24, 2013

(54) METHOD FOR MANUFACTURING SEMICONDUCTOR DEVICE

(75) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 159 days.

(21) Appl. No.: 13/046,863

(22) Filed: Mar. 14, 2011

(65) Prior Publication Data

US 2011/0165702 A1    Jul. 7, 2011

Related U.S. Application Data

(60) Division of application No. 11/957,752, filed on Dec. 17, 2007, now Pat. No. 7,928,479, which is a continuation of application No. PCT/JP2005/011142, filed on Jun. 17, 2005.

(51) Int. Cl.
    *H01L 21/02* (2006.01)

(52) U.S. Cl.
    USPC 438/3; 257/295; 257/E21.009; 257/E21.021; 257/E21.04; 257/E21.664; 257/E27.104

(58) Field of Classification Search
    USPC .......................................... 257/295, E21.649
    See application file for complete search history.

(56) References Cited

U.S. PATENT DOCUMENTS

| 7,176,132 B2 * | 2/2007 | Sashida et al. ............. 438/677 |
| 7,390,678 B2 | 6/2008 | Wang et al. |
| 7,456,454 B2 | 11/2008 | Sashida |
| 7,745,232 B2 | 6/2010 | Sashida |
| 2003/0089954 A1 | 5/2003 | Sashida |
| 2004/0166596 A1 | 8/2004 | Sashida et al. |
| 2005/0006680 A1 * | 1/2005 | Song et al. .................. 257/295 |
| 2005/0006683 A1 | 1/2005 | Kim et al. |

(Continued)

FOREIGN PATENT DOCUMENTS

| JP | 09-251983 A | 9/1997 |
| JP | 2000-133633 A | 5/2000 |

(Continued)

OTHER PUBLICATIONS

H. Mori et al., A High-endurance 96-Kbit FeRAM Embedded in a Smart Card LSI Using Ir/IrO2/PZT(MOCVD)Ir Ferroelectric Capacitors, 2001 6th International Conference on Solid-State and Integrated-Circuit Technology Proceedings, pp. 195-199; Cited ISR.

(Continued)

*Primary Examiner* — Matthew W Such
*Assistant Examiner* — David Spalla
(74) *Attorney, Agent, or Firm* — Westerman, Hattori, Daniels & Adrian, LLP

(57) ABSTRACT

A ferroelectric capacitor is formed over a semiconductor substrate (10), and thereafter, interlayer insulating films (48, 50, 52) covering the ferroelectric capacitor are formed. Next, a contact hole (54) reaching a top electrode (40) is formed in the interlayer insulating films (48, 50, 52). Next, a wiring (58) electrically connected to the top electrode (40) through the contact hole (54) is formed on the interlayer insulating films (48, 50, 52). At the time of forming the top electrode (40), conductive oxide films (40a, 40b) are formed, and then a cap film (40c) composed of a noble metal exhibiting less catalytic action than Pt and having a thickness of 150 nm or less is formed on the conductive oxide films (40a, 40b).

10 Claims, 16 Drawing Sheets

(56) References Cited

U.S. PATENT DOCUMENTS

| | | |
|---|---|---|
| 2005/0205910 A1 | 9/2005 | Kumura et al. |
| 2005/0244988 A1 | 11/2005 | Wang et al. |
| 2006/0073613 A1* | 4/2006 | Aggarwal et al. ............ 438/3 |
| 2009/0068764 A1 | 3/2009 | Sashida |

FOREIGN PATENT DOCUMENTS

| | | |
|---|---|---|
| JP | 2000-349246 A | 12/2000 |
| JP | 2000-349253 A | 12/2000 |
| JP | 2002-057297 A | 2/2002 |
| JP | 2002-094023 A | 3/2002 |
| JP | 2003-152165 A | 5/2003 |
| JP | 2003-179212 A | 6/2003 |
| JP | 2004-087978 A | 3/2004 |
| JP | 2004-296535 A | 10/2004 |
| JP | 2005-129852 A | 5/2005 |
| WO | 2004/093193 A1 | 10/2004 |

OTHER PUBLICATIONS

International Search Report of PCT/JP2005/011142, date of mailing Sep. 20, 2005.

Notificational of Transmittal of Translation of the International Preliminary Report on Patentability (Form PCT/IB/338) of International Application No. PCT/2005/011142 mailed Jan. 3, 2008 with form PCT/IB/373 and PCT/ISA/237.

Japanese Office Action dated May 8, 2012, issued in corresponding Japanese Patent Application No. 2007-521049 w/partial translation. (4 pages).

* cited by examiner

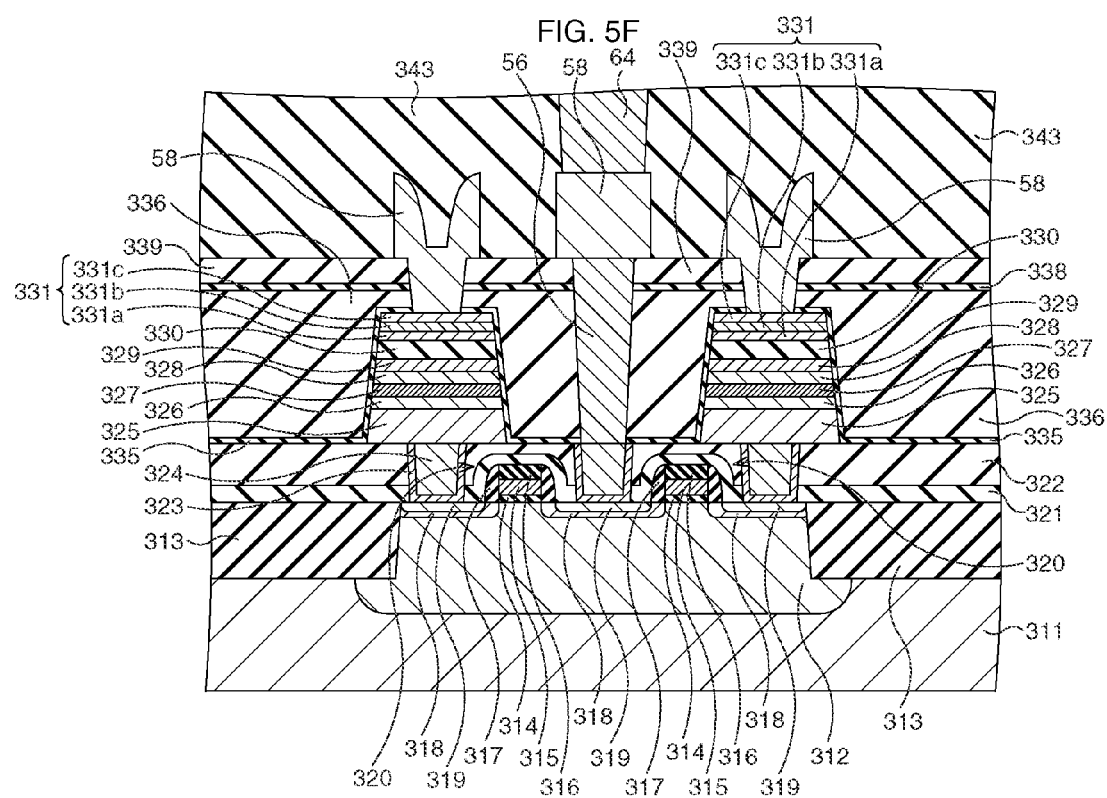

METHOD FOR MANUFACTURING SEMICONDUCTOR DEVICE

CROSS-REFERENCE TO RELATED APPLICATIONS

This application is a divisional of U.S. application Ser. No. 11/957,752, filed on Dec. 17, 2007, which is a continuation of International Application No. PCT/JP2005/011142 filed Jun. 17, 2005.

BACKGROUND FIELD

The embodiments discussed herein are directed to a semiconductor device suitable for a nonvolatile memory including a ferroelectric capacitor, and a method for manufacturing the same.

DESCRIPTION OF THE RELATED ART

In recent years, with the advance of digital technology, there has been a growing trend to process or store large-volume data at a high speed. Therefore, high integration and high performance of semiconductor devices used for electronic equipment are in demand.

Thus, in order to realize high integration of a semiconductor memory device (DRAM), research and development are extensively conducted on the art of using a ferroelectric material or a high dielectric constant material as a capacitor insulating film of a capacitor element constituting a DRAM, instead of a silicon oxide or a silicon nitride.

In order to realize a nonvolatile RAM capable of a write operation and a read operation at low voltage at a high speed, research and development are also keenly conducted on a ferroelectric memory (FeRAM) using a ferroelectric film having a spontaneous polarization characteristic as a capacitor insulating film.

A ferroelectric memory stores information by using a hysteresis characteristic of a ferroelectric. In a ferroelectric memory, a ferroelectric capacitor having a ferroelectric film as a capacitor dielectric film between a pair of electrodes is provided at each memory cell. In a ferroelectric, polarization occurs in accordance with applied voltage between the electrodes, and even when the applied voltage is removed, spontaneous polarization remains. When the polarity of the applied voltage is inversed, the polarity of the spontaneous polarization is also inversed. Therefore, information can be read by detecting the spontaneous polarization. A ferroelectric memory has the characteristics of a high-speed operation, low power consumption, excellent durability of write and read, and the like.

Conventionally, as a top electrode of a ferroelectric capacitor, a conductive oxide film has been used, and as a wiring which is connected to this, the one constituted of a barrier metal film and an Al film is known. In the wiring, a thickness of 100 nm or more is required of the barrier metal film, and a titanium nitride film of a thickness of 150 nm is sometimes used. Meanwhile, in a logic circuit part, a multi-layered body of a titanium film of a thickness of 60 nm and a titanium nitride film of a thickness of 30 nm is sometimes used as a barrier metal film. Thus, the constitutions of the barrier metal films differ between the ferroelectric memory part and the logic circuit part.

There is also a demand for microfabrication with respect to a ferroelectric memory. However, it is difficult to respond to the demand by using a wiring including an Al film.

Thus, in order to solve these problems, use of a plug containing tungsten is under consideration.

However, in order to form such a plug, it is necessary to form a tungsten film in a reducing atmosphere at a high temperature after forming a titanium film or a titanium nitride film as a glue film, and hydrogen generates at this time. Most of the hydrogen is blocked by the titanium nitride film, but when a large amount of hydrogen generates, it sometimes reaches the top electrode. The hydrogen reduces the conductive oxide film, for example, an iridium oxide film, constituting the top electrode. As a result, as shown in FIG. 6, a void occurs between the top electrode and the plug with volumetric shrinkage, and contact resistance becomes unstable.

Further, the titanium film or the titanium nitride film is oxidized by oxygen in the conductive oxide film, and contact resistance sometimes rises.

In order to solve the problems, various structures of the top electrodes are proposed (Patent Documents 1 to 5). However, by these structures, it is difficult to suppress rise in contact resistance sufficiently to stabilize it.

Patent Document 1: Japanese Patent Application Laid-open No. 2000-349246

Patent Document 2: Japanese Patent Application Laid-open No. 2000-349253

Patent Document 3: Japanese Patent Application Laid-open No. 9-251983

Patent Document 4: Japanese Patent Application Laid-open No. 2000-133633

Patent Document 5: Japanese Patent Application Laid-open No. 2004-87978

SUMMARY

A semiconductor device according to the present embodiment is provided with: a ferroelectric capacitor formed over a semiconductor substrate, and including a bottom electrode, a ferroelectric film and a top electrode; an interlayer insulating film covering the ferroelectric capacitor, and in which a contact hole reaching the top electrode is formed; and a wiring formed on the interlayer insulating film, and being electrically connected to the top electrode through the contact hole. The top electrode is provided with a conductive oxide film, and a cap film formed on the conductive oxide film, composed of a noble metal having less catalytic action than Pt (platinum), and having a thickness of 150 nm or less.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 5F is a sectional view showing the method for manufacturing a ferroelectric memory in sequence of process steps, following FIG. 5E.

DETAILED DESCRIPTION OF THE PREFERRED EMBODIMENTS

Figure 1:
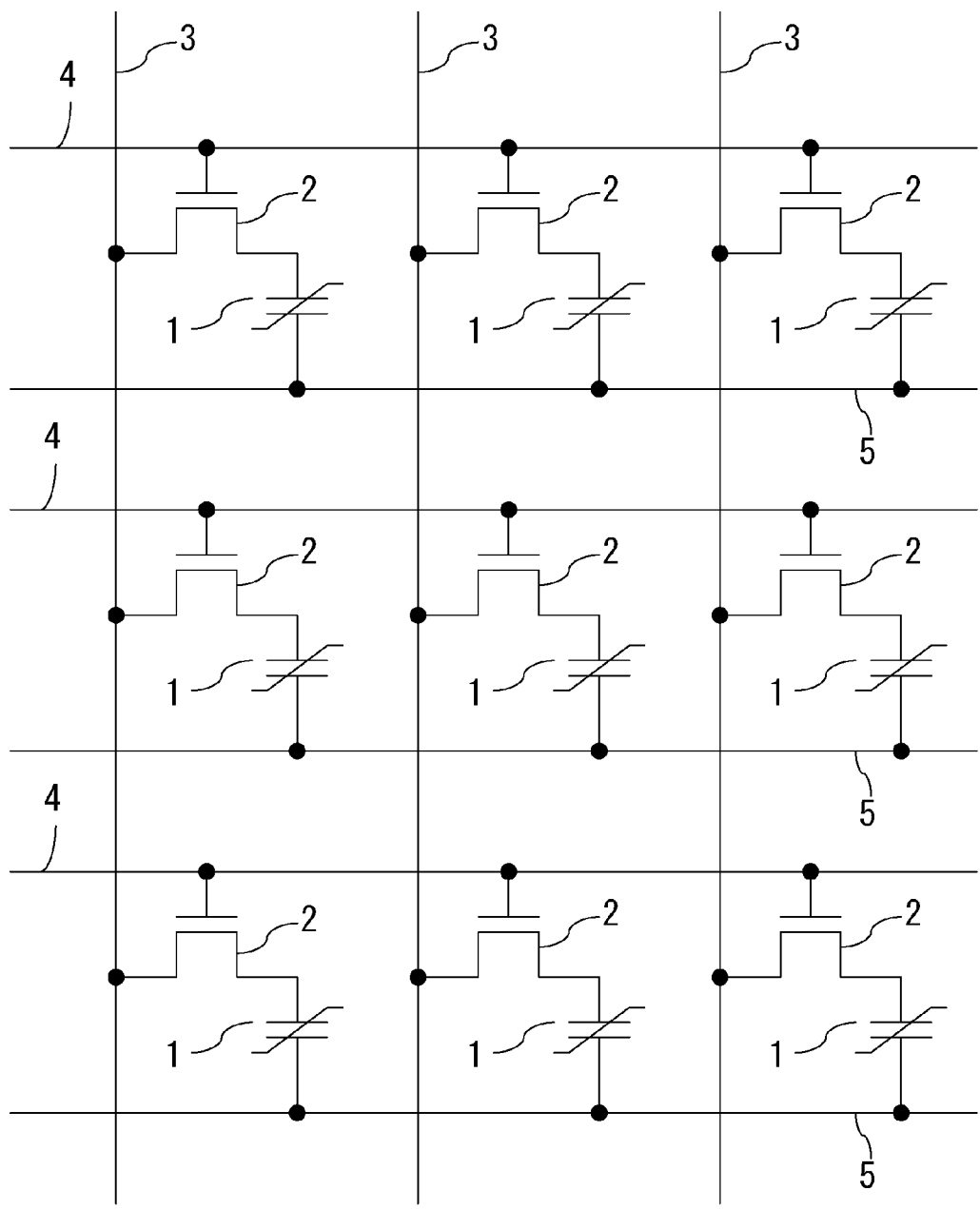
FIG. 1 is a circuit diagram showing a configuration of a memory cell array of a ferroelectric memory (semiconductor device) manufactured by a method according to an embodiment.

Hereinafter, embodiments will be described in concrete with reference to the accompanying drawings. FIG. 1 is a circuit diagram showing a configuration of a memory cell array of a ferroelectric memory (semiconductor device) manufactured by a method according to the embodiments.

The memory cell array is provided with a plurality of bit lines 3 extending in one direction, and a plurality of word lines 4 and plate lines 5 which extend in the direction perpendicular to the direction in which the bit lines 3 extend. A plurality of memory cells of a ferroelectric memory are disposed in an array form so as to conform to a lattice configured by the bit lines 3, word lines 4 and plate lines 5. Each of the memory cells is provided with a ferroelectric capacitor (storage part) 1 and a MOS transistor (switching part) 2.

A gate of the MOS transistor 2 is connected to the word line 4. One source/drain of the MOS transistor 2 is connected to the bit line 3, and the other source/drain is connected to one electrode of the ferroelectric capacitor 1. The other electrode of the ferroelectric capacitor 1 is connected to the plate line 5. Each of the word lines 4 and each of the plate lines 5 are shared by a plurality of MOS transistors 2 arranged in the same direction as the direction in which they extend. Similarly, each of the bit lines 3 is shared by a plurality of MOS transistors 2 arranged in the same direction as the direction in which it extends. The direction in which the word line 4 and the plate line 5 extend is sometimes called a row direction, and the direction in which the bit line 3 extends is sometimes called a column direction. It should be noted that, the disposition of the bit line 3, the word line 4 and the plate line 5 are not limited to the above described one.

In the memory cell array of the ferroelectric memory thus configured, data is stored in accordance with the polarization state of the ferroelectric film provided in the ferroelectric capacitor 1.

First Embodiment

Next, a first embodiment will be described. Here, the cross-sectional structure of a semiconductor device will be described with a manufacturing method of it for convenience. FIGS. 2A to 2L are sectional views showing a method for manufacturing a ferroelectric memory (semiconductor device) according to the first embodiment in sequence of process steps.

Figure 2A:
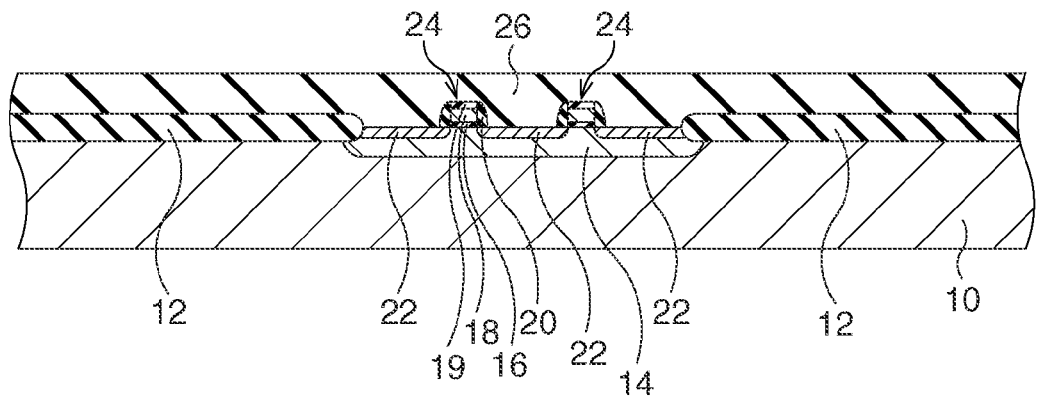
FIG. 2A is a sectional view showing a method for manufacturing a ferroelectric memory according to a first embodiment in sequence of process steps.

First, as shown in FIG. 2A, an element isolation region 12 which defines an element region is formed on a semiconductor substrate 10 such as a silicon substrate by, for example, an LOCOS (Local Oxidation of Silicon) method. Next, by introducing a dopant impurity by an ion implanting method, a well 14 is formed. Next, transistors 24 each including a gate insulating film 16, a gate electrode (gate wiring) 18, an insulating film 19, a side wall insulating film 20 and source/drain diffusion layers 22 are formed in the element region. The transistor 24 corresponds to the MOS transistor 2 in FIG. 1.

Next, an SiON film (silicon oxynitride film) of a thickness of 200 nm, for example, is formed on an entire surface by, for example, a plasma CVD (Chemical Vapor Deposition) method. Further, a silicon oxide film of a thickness of 600 nm, for example, is formed on the entire surface by a plasma TEOSCVD method. An interlayer insulating film 26 is constituted of the SiON film and the silicon oxide film. Next, the surface of the interlayer insulating film 26 is flattened by, for example, a CMP method.

Figure 2B:
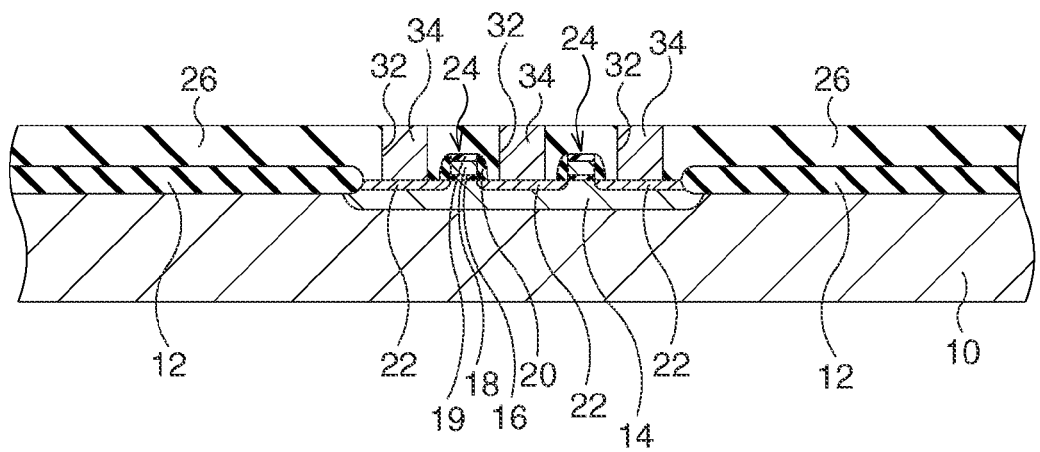
FIG. 2B is a sectional view showing the method for manufacturing a ferroelectric memory in sequence of process steps, following FIG. 2A.

Next, as shown in FIG. 2B, contact holes 32 reaching the source/drain diffusion layers 22, and contact holes (not shown) reaching the gate electrodes (gate wirings) 18 are formed in the interlayer insulating film 26 by using a photolithography technique. Next, a Ti film of a thickness of 20 nm to 60 nm is formed on the entire surface by, for example, a sputtering method. Thereafter, a TiN film of a thickness of 30 nm to 50 nm is formed by, for example, a sputtering method or a CVD method. A barrier metal film (not shown) is constituted of the Ti film and the TiN film.

Next, a tungsten film (not shown) of a thickness of 500 nm is formed on the entire surface by, for example, a CVD method. The tungsten film and the barrier metal film are polished by a CMP method until the surface of the interlayer insulating film 26 is exposed. As a result, conductive plugs 34 buried in the contact holes 32 and so on and containing tungsten are formed.

Figure 2C:
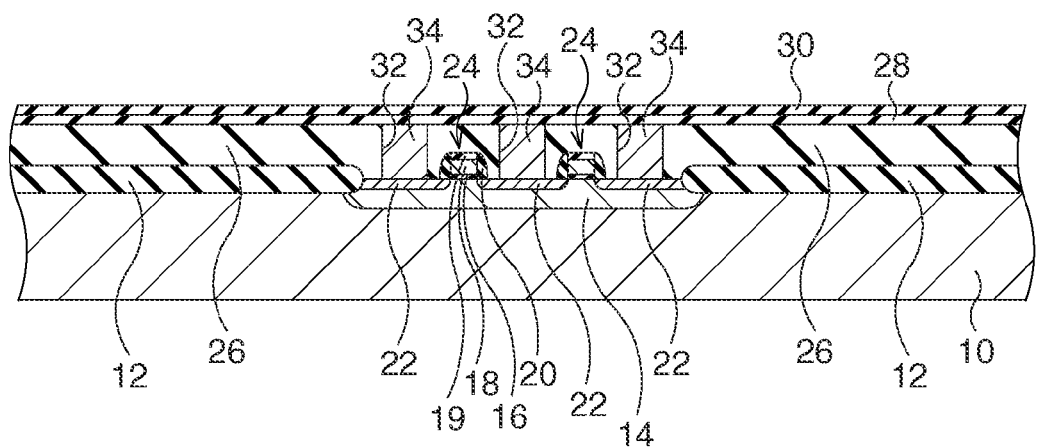
FIG. 2C is a sectional view showing the method for manufacturing a ferroelectric memory in sequence of process steps, following FIG. 2B.

Next, as shown in FIG. 2C, an oxidation preventing film 28 of a thickness of 100 nm is formed on the entire surface by, for example, a plasma CVD method. As the oxidation preventing film 28, for example, an SiON film or a silicon nitride film is formed. Next, a silicon oxide film 30 of a thickness of 130 nm is formed on the entire surface by, for example, a plasma TEOSCVD method. Subsequently, thermal treatment is performed in a nitrogen ($N_2$) atmosphere. For example, the thermal treatment temperature is set at 650° C. and the thermal treatment time is set at 30 minutes to 60 minutes.

Figure 2D:
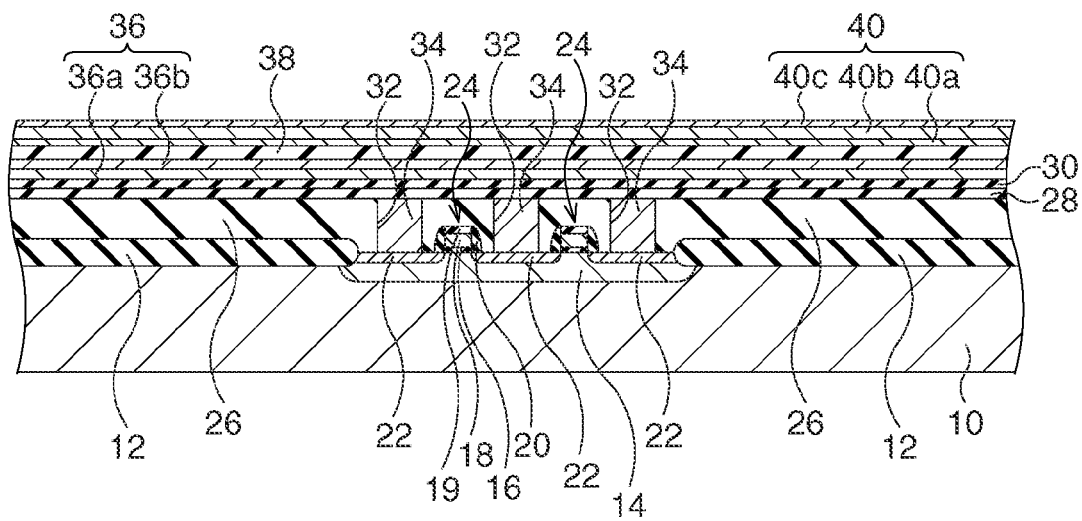
FIG. 2D is a sectional view showing the method for manufacturing a ferroelectric memory in sequence of process steps, following FIG. 2C.

Next, as shown in FIG. 2D, a titanium film 36a of a thickness of 20 nm to 100 nm (for example, 20 nm) is formed on the entire surface as a Pt film adhesive layer by, for example, a sputtering method or a CVD method. Further, a Pt film 36b of a thickness of 100 nm to 300 nm (for example, 175 nm) is formed on the entire surface as a bottom electrode film by, for example, a sputtering method. The titanium film 36a and the Pt film 36b constitute a bottom electrode film 36 of a ferroelectric capacitor.

Next, as also shown in FIG. 2D, a ferroelectric film 38 is formed on the entire surface by, for example, a sputtering method. As the ferroelectric film 38, a PZT film of a thickness of 100 nm to 250 nm (for example, 200 nm), for example, is formed. The method for forming the ferroelectric film 38 is not limited to a sputtering method. The ferroelectric film 38 may be formed by, for example, a sol-gel method, an MOD (Metal Organic Decomposition) method, an MOCVD method or the like.

Next, thermal treatment is performed under an oxygen atmosphere by, for example, an RTA (Rapid Thermal Annealing) method. For example, the thermal treatment temperature is set at 650° C. to 800° C. (for example, 750° C.), and the thermal treatment time is set at 30 seconds to 120 seconds (for example, 60 seconds).

Next, as also shown in FIG. 2D, an $IrO_X$ film 40a of a thickness of 10 nm to 100 nm (for example, 50 nm), and an $IrO_Y$ film 40b of a thickness of 100 nm to 300 nm, for example, are successively formed by, for example, a sputtering method or an MOCVD method. On this occasion, in order to suppress in-process degradation, a composition ratio Y of the oxygen of the $IrO_Y$ film 40b is made higher than a composition ratio X of the oxygen of the $IrO_X$ film 40a.

Further, as also shown in FIG. 2D, a noble metal cap film 40c of a thickness of 5 nm to 150 nm (for example, 30 nm) is formed by, for example, a sputtering method or an MOCVD method. As the noble metal cap film 40c, a film composed of a noble metal having less catalytic action than Pt, for example, an iridium (Ir) film, a ruthenium (Ru) film, a rhodium (Rh) film or a palladium (Pd) film is preferably formed. The deposition temperature in the case of forming an Ir film as the noble metal cap film 40c is set at, for example, 430° C. The deposition temperature in the case of forming an Ru film is set at, for example, 400° C. The $IrO_X$ film 40a, the $IrO_Y$ film 40b and the noble metal cap film 40c constitute a top electrode film 40 of the ferroelectric capacitor.

When a Pt film is formed on the $IrO_Y$ film 40b, hydrogen generates from water in the raw material due to the catalytic action of Pt when an interlayer insulating film is formed later by a CVD method such as a plasma TEOSCVD method, and the characteristics of the ferroelectric film 38 are degraded. After the top electrode film 40 is etched later, recovery annealing is performed, and at this time, a projection (hillock) sometimes occurs at the surface of the Pt film.

Figure 2E:
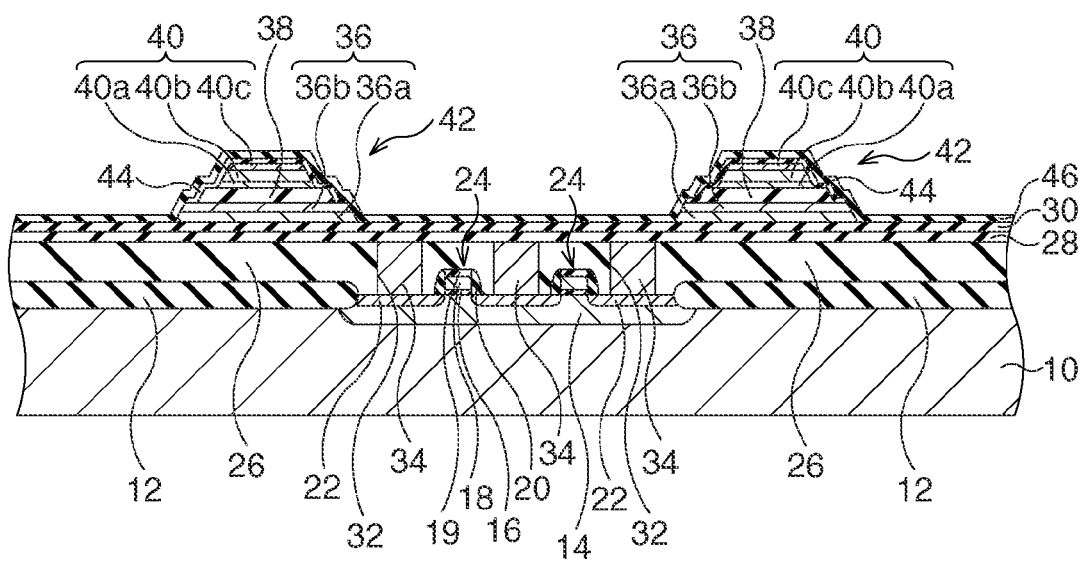
FIG. 2E is a sectional view showing the method for manufacturing a ferroelectric memory in sequence of process steps, following FIG. 2D.

Next, a photoresist film (not shown) is formed on the entire surface by, for example, a spin coating method, and the photoresist film is patterned into a plane shape of a top electrode of the ferroelectric capacitor by photolithography. Subsequently, as shown in FIG. 2E, the top electrode film 40 is etched. As the etching gas, for example, Ar gas and $Cl_2$ gas are used. Thereafter, the photoresist film is removed. Etching of the top electrode film 40 may be performed by using a hard mask consisting of a titanium nitride film. Next, thermal treatment (recovery annealing) at 400° C. to 700° C. (for example, 650° C.) for 30 minutes to 120 minutes (for example, 60 minutes) is performed under, for example, an oxygen atmosphere. The thermal treatment is for improving the property of the ferroelectric film 38. Since the noble metal cap film 40c is thin, oxygen can be caused to reach the ferroelectric film 38 sufficiently, and the ferroelectric film 38 can be sufficiently recovered irrespective of the size of the top electrode. Further, a hillock does not occur to the surface of the noble metal cap film 40c.

Next, a photoresist film (not shown) is formed on the entire surface by, for example, a spin coating method, and the photoresist film is patterned into a plane shape of a capacitor insulating film by photolithography. Subsequently, the ferroelectric film 38 is etched. Thereafter, the photoresist film is removed. Next, thermal treatment at 300° C. to 400° C. (for example, 350° C.) for 30 minutes to 120 minutes (for example, 60 minutes) is performed under an oxygen atmosphere.

Next, as also shown in FIG. 2E, a barrier film 44 is formed by, for example, a sputtering method or a CVD method. As the barrier film 44, an aluminum oxide film of a thickness of 20 nm to 150 nm, for example, is formed. The method for forming the aluminum oxide film is not limited to a sputtering method or a CVD method, but considering damage to the ferroelectric film 38, the methods other than an MOCVD method are preferably adopted. Next, thermal treatment at, for example, 400° C. to 600° C. for 30 minutes to 120 minutes is performed under an oxygen atmosphere.

Next, a photoresist film (not shown) is formed on the entire surface by, for example, a spin coating method, and the photoresist film is patterned into a plane shape of a bottom electrode of the ferroelectric capacitor by photolithography. Subsequently, the barrier film 44 and the bottom electrode film 36 are etched. As a result, the bottom electrode is formed. The patterned top electrode film 40, ferroelectric film 38 and bottom electrode film 36 constitute a ferroelectric capacitor 42, and the ferroelectric capacitor 42 corresponds to the ferroelectric capacitor 1 in FIG. 1. The barrier film 44 remains to cover the top electrode film 40 and the ferroelectric film 38. Thereafter, the photoresist film is removed. Next, thermal treatment at, for example, 350° C. to 600° C. for 30 minutes to 60 minutes is performed under an oxygen atmosphere.

Next, a barrier film 46 is formed on the entire surface by, for example, a sputtering method or a CVD method. As the barrier film 46, an aluminum oxide film of a thickness of 20 nm to 50 nm, for example, is formed. The entire ferroelectric capacitor 42 is covered with the barrier film 46.

After the formation of the barrier film 46, thermal treatment at, for example, 500° C. to 700° C. for 30 minutes to 120 minutes is performed under an oxygen atmosphere. As a result, oxygen is supplied to the ferroelectric film 38, and the electric characteristic of the ferroelectric capacitor 42 is recovered.

Figure 2F:
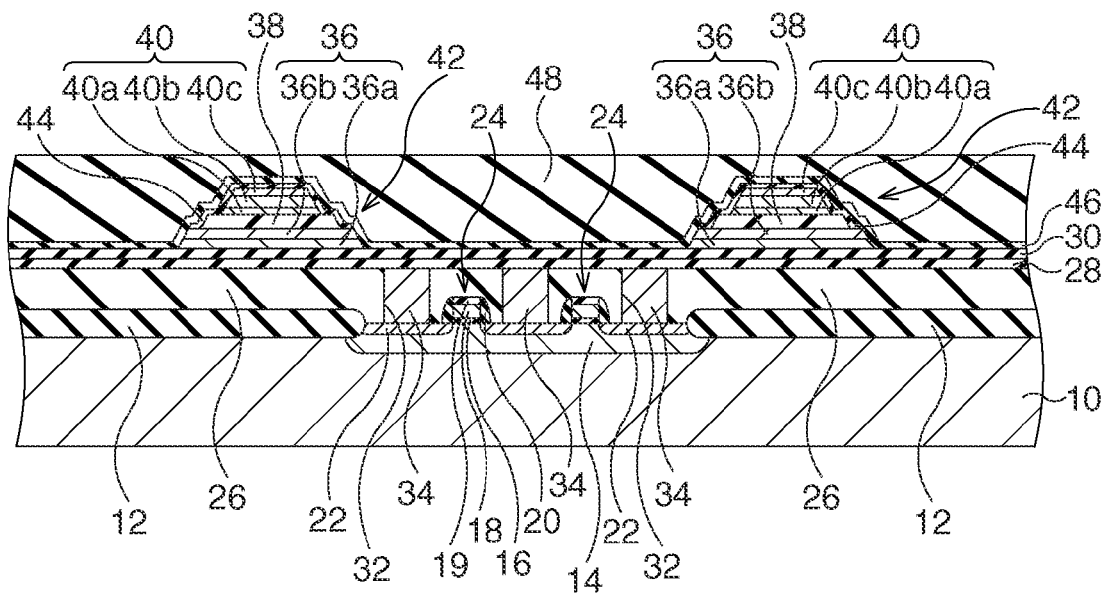
FIG. 2F is a sectional view showing the method for manufacturing a ferroelectric memory in sequence of process steps, following FIG. 2E.

Next, as shown in FIG. 2F, an interlayer insulating film 48 constituted of a silicon oxide of a thickness of 1500 nm, for example, is formed on the entire surface by, for example, a plasma TEOSCVD method. When a silicon oxide film is formed as the interlayer insulating film 48, a mixture gas of, for example, TEOS gas, oxygen gas and helium gas is used as a source gas. As the interlayer insulating film 48, for example, an inorganic film or the like having insulating properties may be formed. After the formation of the interlayer insulating film 48, the surface of the interlayer insulating film 48 is flattened by, for example, a CMP method.

Next, thermal treatment is performed under a plasma atmosphere which is generated by using $N_2O$ gas, $N_2$ gas or the like. As a result of thermal treatment, moisture in the interlayer insulating film 48 is removed, the property of the interlayer insulating film 48 changes, and it becomes difficult for moisture to enter the interlayer insulating film 48. The substrate temperature in this thermal treatment is set at, for example 350° C. The flow rate of the $N_2O$ gas is set at, for example, 1000 sccm. The flow rate of the $N_2$ gas is set at, for example, 285 sccm. The gap of the opposed electrodes is set at, for example, 7.62 mm (0.3 inches). The high frequency power which is applied is set at, for example, 525 W. The atmospheric pressure in the chamber is set at, for example, about 400 Pa (3 Torr). After the thermal treatment is performed, the interlayer insulating film 48 may be exposed to the plasma atmosphere generated by using $N_2O$ gas or the like. By the thermal treatment, the moisture existing in the interlayer insulating film 48 is removed. When the inter layer insulating film 48 is subsequently exposed to the plasma atmosphere generated by using $N_2O$ gas or the like, the property of the interlayer insulating film 48 changes, and it becomes difficult for moisture to entire the interlayer insulating film 48.

Figure 2G:
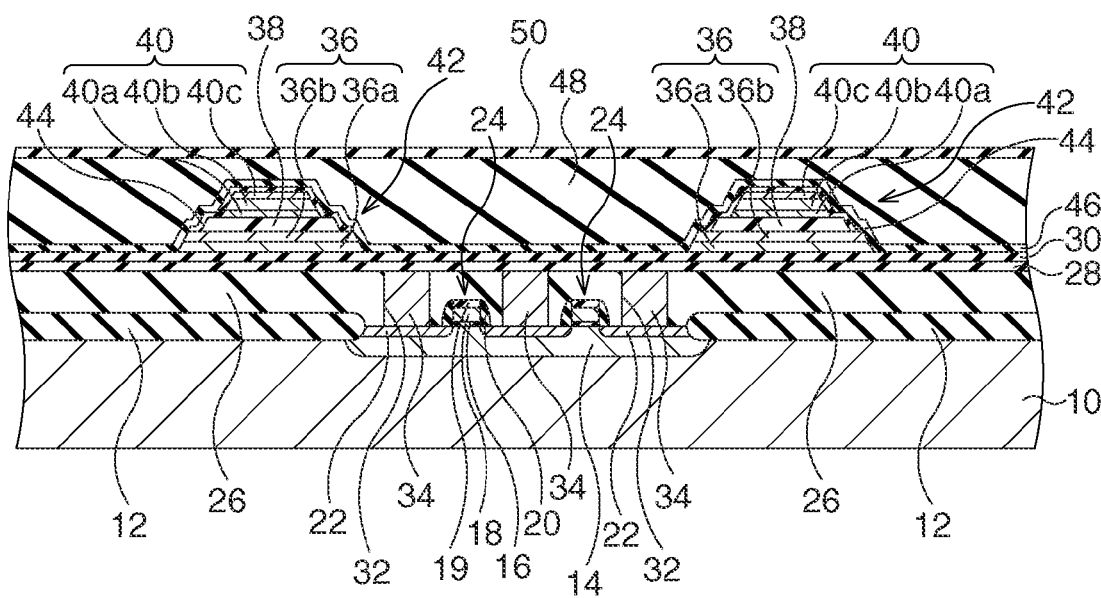
FIG. 2G is a sectional view showing the method for manufacturing a ferroelectric memory in sequence of process steps, following FIG. 2F.

Next, as shown in FIG. 2G, a barrier film 50 is formed on the entire surface by, for example, a sputtering method or a CVD method. As the barrier film 50, an aluminum oxide film of a thickness of 20 nm to 100 nm, for example, is formed. The barrier film 50 is formed on the flattened interlayer insulating film 48, and therefore, the barrier film 50 becomes flat.

Figure 2H:
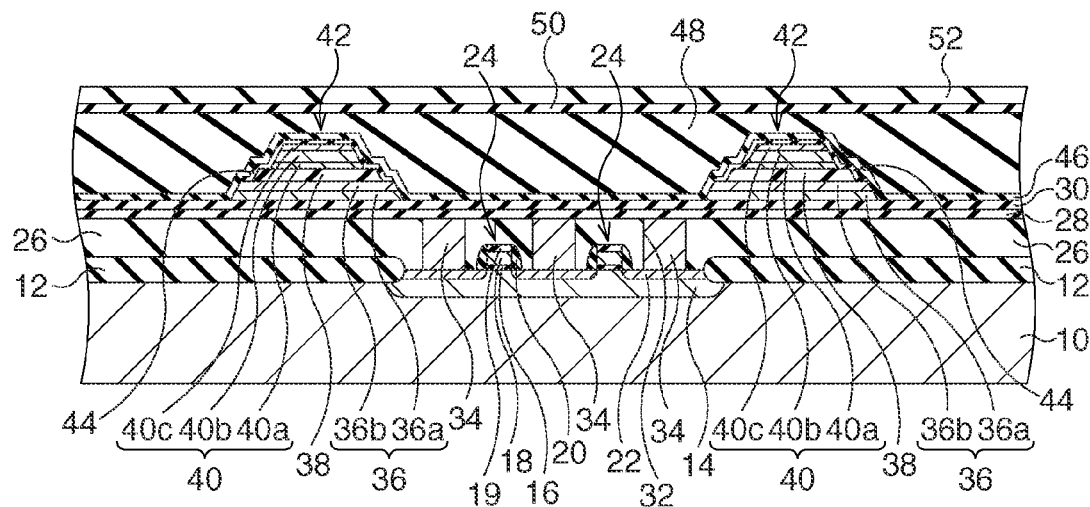
FIG. 2H is a sectional view showing the method for manufacturing a ferroelectric memory in sequence of process steps, following FIG. 2G.

Next, as shown in FIG. 2H, an interlayer insulating film 52 is formed on the entire surface by, for example, a plasma TEOSCVD method. As the interlayer insulating film 52, a silicon oxide film of a thickness of 100 nm to 300 nm, for example, is formed. As the interlayer insulating film 52, an SiON film, a silicon nitride film or the like may be formed. Next, the surface of the interlayer insulating film 52 is flattened by, for example, a CMP method.

Figure 2I:
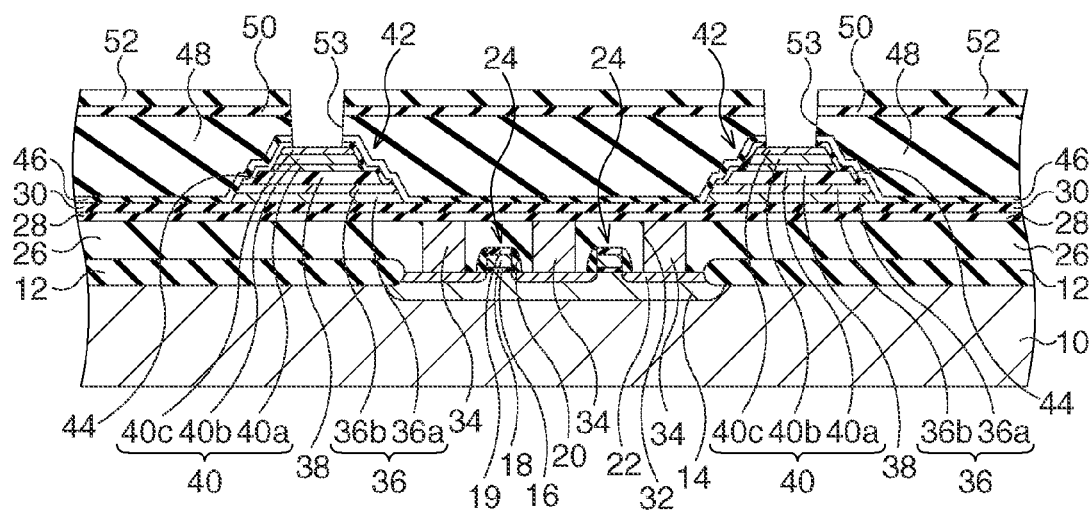
FIG. 2I is a sectional view showing the method for manufacturing a ferroelectric memory in sequence of process steps, following FIG. 2H.

Next, as shown in FIG. 2I, contact holes 53 reaching the top electrodes 40 of the ferroelectric capacitors 42, and contact holes (not shown) reaching the bottom electrodes 36 of the ferroelectric capacitors 42 are formed in the interlayer insulating film 52, the barrier film 50 and the interlayer insulating film 48 by using a photolithography technique.

Next, thermal treatment at 400° C. to 600° C. for 30 minutes to 120 minutes (60 minutes) is performed under an oxygen atmosphere. The substrate temperature is set at, for example, 500° C. to 600° C. As a result, oxygen is supplied to the ferroelectric films 38, and the electric characteristic of the ferroelectric capacitors 42 is recovered. The thermal treatment may be performed in an ozone atmosphere instead of the oxygen atmosphere. When the thermal treatment is performed in an ozone atmosphere, oxygen is also supplied to the ferroelectric films 38, and the electric characteristic of the ferroelectric capacitors 42 is recovered.

Figure 2J:
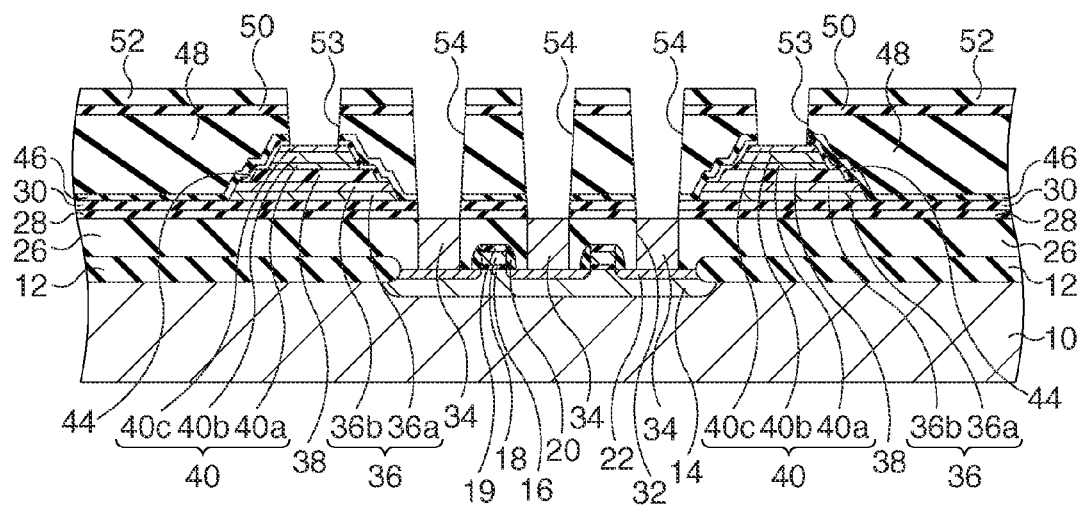
FIG. 2J is a sectional view showing the method for manufacturing a ferroelectric memory in sequence of process steps, following FIG. 2I.

Thereafter, as shown in FIG. 2J, contact holes 54 reaching the conductive plugs 34 are formed in the interlayer insulating film 52, the barrier film 50, the interlayer insulating film 48, the barrier film 46, the silicon oxide film 30 and the oxidation preventing film 28 by using a photolithography technique. Subsequently, plasma cleaning using Ar gas is performed. As a result, a natural oxide film and the like existing on the surface of the conductive plugs 34 are removed. As the condition of the plasma cleaning, such a condition that a thermal oxide film is removed by 10 nm, for example, is adopted. As will be described later, the plasma cleaning may be omitted.

Figure 2K:
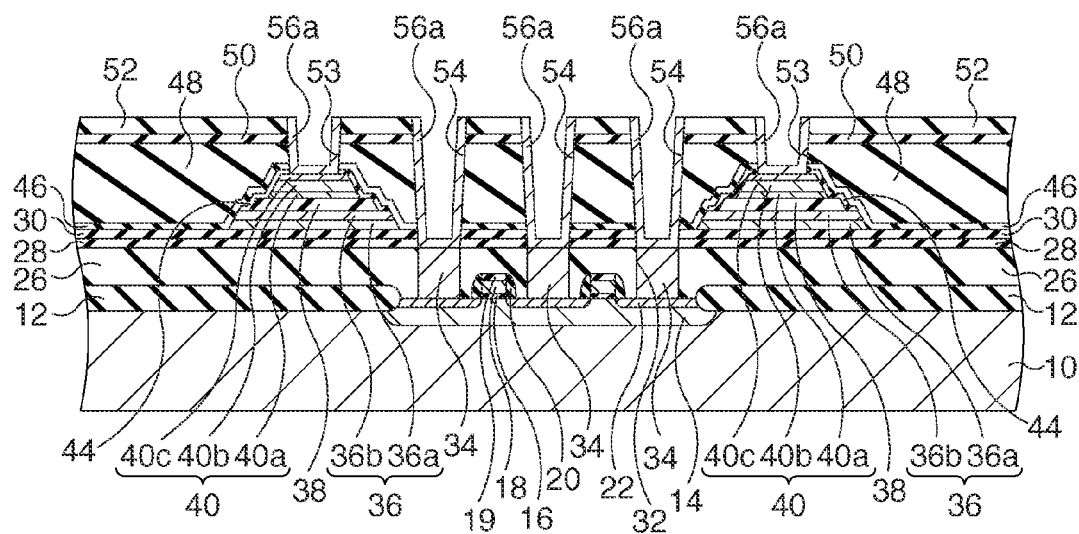
FIG. 2K is a sectional view showing the method for manufacturing a ferroelectric memory in sequence of process steps, following FIG. 2J.

Next, a TiN film 56a of a thickness of 20 nm to 100 nm is formed on the entire surface as a glue film by, for example, a sputtering method, as shown in FIG. 2K. When the glue film is formed, a Ti film may be formed by a sputtering method, and thereafter, a TiN film may be formed by an MOCVD method. After the TiN film is formed by the MOCVD method, annealing treatment using plasma of $N_2$ and $H_2$ at 400° C. or higher needs to be performed as decarbonization treatment. In this embodiment, the noble metal cap 40c which functions as a hydrogen-resistant prevention film is formed, and the degree of the abnormal irregularities on its surface is extremely small. Therefore, there occur no problems of abnormal oxidization of the Ti film and reduction of the top electrode.

Figure 2L:
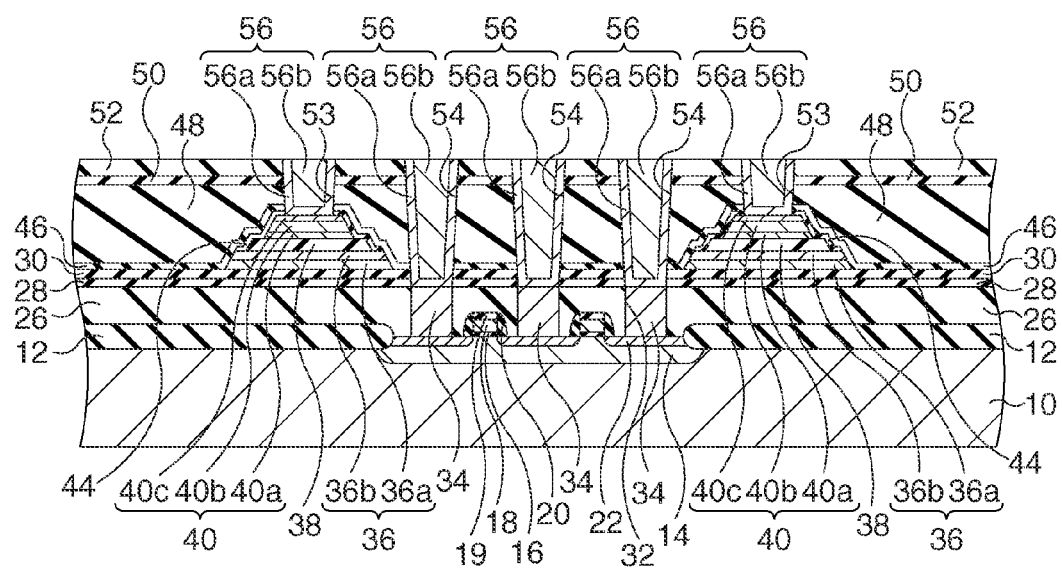
FIG. 2L is a sectional view showing the method for manufacturing a ferroelectric memory in sequence of process steps, following FIG. 2K.

Next, a tungsten film 56b of a thickness of 300 nm to 600 nm is formed on the entire surface by, for example, a CVD method. When the tungsten film 56b is formed, the supply amount of hydrogen is made larger at the later stage than at the earlier stage, for example. Thereafter, the tungsten film 56b and the TiN film 56a are polished by, for example, a CMP method until the surface of the interlayer insulating film 52 is exposed. As a result, as shown in FIG. 2L, conductive plugs 56 which are buried in the contact holes 53, 54 and the like and contain tungsten are formed.

Next, thermal treatment is performed under a plasma atmosphere generated by using $N_2O$ gas, $N_2$ gas or the like. As a result of the thermal treatment, moisture which enters the interlayer insulating films 52 and 50 on the occasion of polishing the tungsten film 56b and so on is removed, the property of the interlayer insulating film 52 changes, and it becomes difficult for moisture to enter the interlayer insulating film 52. By the thermal treatment, the surface of the interlayer insulating film 52 is nitrided, and an SiON film (not shown) is formed on the surface of the interlayer insulating film 52. The substrate temperature in the thermal treatment is set at, for example, 350° C. The flow rate of the $N_2O$ gas is set at, for example, 1000 sccm. The flow rate of $N_2$ gas is set at, for example, 285 sccm. The gap of the opposed electrodes is set at, for example, 7.62 mm (0.3 inches). The high frequency power which is applied is set at, for example, 525 W. The atmospheric pressure in the chamber is set at, for example, about 400 Pa (3 Torr). Subsequently, plasma cleaning using Ar gas is performed. As a result, natural oxide films and the like existing on the surfaces of the conductive plugs 56 are removed. As the condition of the plasma cleaning, such a condition that a thermal oxide film is removed by 10 nm, for example, is adopted.

Figure 2M:
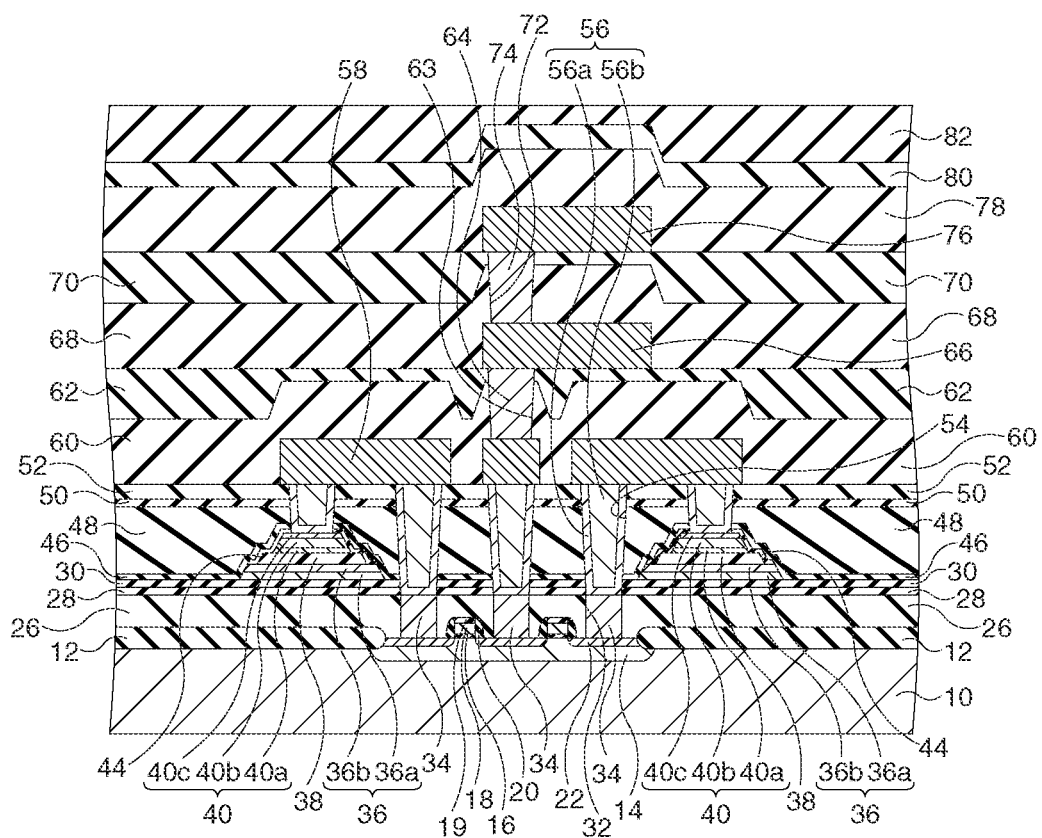
FIG. 2M is a sectional view showing the method for manufacturing a ferroelectric memory in sequence of process steps, following FIG. 2L.

Next, a Ti film of a thickness of 60 nm, a TiN film of a thickness of 30 nm, an AlCu alloy film of a thickness of 360 nm, a Ti film of a thickness of 5 nm, and a TiN film of a thickness of 70 nm (all of them are not shown) are formed in sequence by, for example, a sputtering method. As a result, a stacked film constituted of the Ti film, the TiN film, the AlCu alloy film, the Ti film and the TiN film is formed. Next, the stacked film is patterned by using a photolithography technique. As a result, as shown in FIG. 2M, wirings (first metal wiring layer) 58 constituted of the stacked film are formed.

Next, a silicon oxide film 60 of a thickness of 750 mm is formed by, for example, a high density plasma enhanced CVD (Chemical Vapor Deposition) method. Next, a silicon oxide film 62 of a thickness of 1100 nm, for example, is formed by a plasma TEOSCVD method. As a source gas, mixture gas of, for example, TEOS gas, oxygen gas and helium gas is used. The methods for forming the silicon oxide films 60 and 62 are not limited to the above described ones. For example, both of the silicon oxide films 60 and 62 may be formed by a plasma TEOSCVD method.

Next, the surface of the silicon oxide film 62 is flattened by, for example, a CMP method. Subsequently, thermal treatment is performed under a plasma atmosphere generated by using $N_2O$ gas or the like. As a result of the thermal treatment, moisture in the silicon oxide films 62 and 60 is removed, the properties of the silicon oxide films 62 and 60 change, and it becomes difficult for moisture to enter the silicon oxide films 62 and 60. The substrate temperature in the thermal treatment is set at, for example, 350° C.

Next, a contact hole 63 reaching the wiring 58 is formed in the silicon oxide films 62 and 60 by using a photolithography technique. Thereafter, plasma cleaning using Ar gas is performed. As a result, a natural oxide film and the like existing on the surface of the wiring 58 are removed. As the condition of the plasma cleaning, such a condition as to remove a thermal oxide film by 25 nm, for example, is adopted.

Next, a Ti film (not shown) of a thickness of 10 nm is formed by, for example, a sputtering method. Further, a TiN film (not shown) of a thickness of 3.5 nm to 7 nm is formed by, for example, an MOCVD method. The Ti film and the TiN film constitute a barrier metal film. Next, a tungsten film (not shown) of a thickness of 300 nm to 600 nm is formed by, for example, a CVD method.

Subsequently, the tungsten film and the barrier metal film are polished by, for example, a CMP method until the surface of the silicon oxide film 62 is exposed. As a result, a conductive plug 64 which is buried in the contact hole 63 and contains tungsten is formed.

Next, thermal treatment is performed under a plasma atmosphere generated by using $N_2O$ gas, $N_2$ gas or the like. As a result of the thermal treatment, moisture which enters the silicon oxide films 62 and 60 on the occasion of polishing the tungsten film and so on is removed, the properties of the silicon oxide films 62 and 60 change, and it becomes difficult for moisture to enter the silicon oxide films 62 and 60. The substrate temperature in the thermal treatment is set at, for example, 350° C. The flow rate of $N_2O$ gas is set at, for example, 1000 sccm. The flow rate of $N_2$ gas is set at, for example, 285 sccm. The gap of the opposed electrodes is set at, for example, 7.62 mm (0.3 inches). The high frequency power which is applied is set at, for example, 525 W. The atmospheric pressure in the chamber is set at, for example, about 400 Pa (3 Torr).

Next, a Ti film of a thickness of 60 nm, a TiN film of a thickness of 30 nm, an AlCu alloy film of a thickness of 360 nm, a Ti film of a thickness of 5 nm, and a TiN film of a thickness of 70 nm (all of them are not shown) are formed in sequence by, for example, a sputtering method. As a result, a stacked film constituted of the Ti film, the TiN film, the AlCu alloy film, the Ti film and the TiN film is formed. Next, the stacked film is patterned by using a photolithography technique. As a result, a wiring (second metal wiring layer) 66 constituted of the stacked film is formed.

Next, a silicon oxide film 68 of a thickness of 750 mm is formed by, for example, a high density plasma CVD method. Next, a silicon oxide film 70 of a thickness of 1100 nm, for example, is formed by a plasma TEOSCVD method. The methods for forming the silicon oxide films 68 and 70 are not limited to the above described ones. For example, both of the silicon oxide films 68 and 70 may be formed by a plasma TEOSCVD method.

Next, the surface of the silicon oxide film 70 is flattened by, for example, a CMP method. Subsequently, thermal treatment is performed under a plasma atmosphere generated by using $N_2O$ gas, $N_2$ gas or the like. As a result of the thermal treatment, moisture in the silicon oxide films 68 and 70 is removed, the properties of the silicon oxide films 68 and 70 change, and it becomes difficult for moisture to enter the silicon oxide films 68 and 70. The substrate temperature in the thermal treatment is set at, for example, 350° C. The flow rate of the $N_2O$ gas is set at, for example, 1000 sccm. The flow rate of the $N_2$ gas is set at, for example, 285 sccm. The gap of the opposed electrodes is set at, for example, 7.62 mm (0.3 inches). The high frequency power which is applied is set at, for example, 525 W. The atmospheric pressure in the chamber is set at, for example, about 400 Pa (3 Torr).

Next, a contact hole 72 reaching the wiring 66 is formed in the silicon oxide films 68 and 70 by using a photolithography technique. Thereafter, plasma cleaning using Ar gas is performed. As a result, a natural oxide film and the like existing on the surface of the wiring 66 are removed. As the condition of the plasma cleaning, such a condition as to remove a thermal oxide film by 25 nm, for example, is adopted.

Next, a Ti film (not shown) of a thickness of 10 nm is formed by, for example, a sputtering method. Further, a TiN film (not shown) of a thickness of 3.5 nm to 7 nm is formed by, for example, an MOCVD method. The Ti film and the TiN film constitute a barrier metal film. Next, a tungsten film (not shown) of a thickness of 300 nm to 600 nm is formed by, for example, a CVD method.

Subsequently, the tungsten film and the barrier metal film are polished by, for example, a CMP method until the surface of the silicon oxide film 70 is exposed. As a result, a conductive plug 74 which is buried in the contact hole 72 and contains tungsten is formed.

Next, thermal treatment is performed under a plasma atmosphere generated by using $N_2O$ gas, $N_2$ gas or the like. As a result of the thermal treatment, moisture which enters the silicon oxide films 70 and 68 on the occasion of polishing the tungsten film and the like is removed, the properties of the silicon oxide films 70 and 68 change, and it becomes difficult for moisture to enter the silicon oxide films 70 and 68. The substrate temperature in this thermal treatment is set at, for example, 350° C. The flow rate of the $N_2O$ gas is set at, for example, 1000 sccm. The flow rate of the $N_2$ gas is set at, for example, 285 sccm.

Next, a Ti film of a thickness of 60 nm, a TiN film of a thickness of 30 nm, an AlCu alloy film of a thickness of 360 nm, a Ti film of a thickness of 5 nm, and a TiN film of a thickness of 70 nm (all of them are not shown) are formed in sequence by, for example, a sputtering method. As a result, a stacked film constituted of the Ti film, the TiN film, the AlCu alloy film, the Ti film and the TiN film is formed. Next, the stacked film is patterned by using a photolithography technique. As a result, a wiring (third metal wiring layer) 76 constituted of the stacked film is formed.

Next, a silicon oxide film 78 of a thickness of 700 mm is formed by, for example, a high density plasma enhanced CVD method. The method for forming the silicon oxide film 78 is not limited to the above described one. For example, the silicon oxide film 78 may be formed by a plasma TEOSCVD method.

Next, thermal treatment is performed under a plasma atmosphere generated by using $N_2O$ gas, $N_2$ gas or the like. As a result of the thermal treatment, moisture in the silicon oxide film 78 is removed, the property of the silicon oxide film 78 changes, and it becomes difficult for moisture to enter the silicon oxide film 78. The substrate temperature in the thermal treatment is set at, for example, 350° C. The flow rate of the $N_2O$ gas is set at, for example, 1000 sccm. The flow rate of the $N_2$ gas is set at, for example, 285 sccm.

Next, a silicon nitride film 80 of a thickness of 500 nm is formed on the silicon oxide film 78 by, for example, a CVD method. Entry of moisture is interrupted by the silicon nitride film 80, and the harmful effect that the wirings 76, 66, 58 and the like are corroded with moisture is prevented.

Next, an opening (not shown) reaching the electrode pad is formed in the silicon nitride film 80 and the silicon oxide film 78 by using a photolithograph technique. Thereafter, a polyimide film 82 of a thickness of 2 μm to 10 μm, for example, is formed by, for example, a spin coating method. Next, an opening (not shown) reaching the electrode pad is formed in the polyimide film 82 by using a photolithography technique. The semiconductor device according to this embodiment is thus completed.

In the semiconductor device thus manufactured, the noble metal cap film 40c composed of a noble metal having less catalytic action than Pt exists on the uppermost portion of the top electrode. Therefore, even if hydrogen occurs when the tungsten film 56b is formed, the hydrogen does not reach the $IrO_Y$ film 40b and the $IrO_X$ film 40a. Therefore, reduction of the top electrode is suppressed, and contact resistance of the top electrode can be stabilized.

Further, in this embodiment, the interlayer insulation film 52 is formed on the barrier film 50, and the wiring 58 is formed on the interlayer insulating film 52. Accordingly, deterioration of the barrier film 50 is suppressed by the interlayer insulating film 52, and the function of the barrier film 50 can be sufficiently exhibited. The interlayer insulating film 52 is formed on the barrier film 50, and therefore, on the occasion of patterning for forming the wiring 58, the event that the barrier film 50 is etched can be prevented. Further, as for the wiring 58, high reliability can be obtained.

Further, in this embodiment, the conductive plug 56 is not directly connected to the source/drain diffusion layer 14, but is connected to the source/drain diffusion layer 14 via the conductive plug 34.

If the conductive plug 56 is to be directly connected to the source/drain diffusion layer 14, a contact hole reaching the source/drain diffusion layer 14 needs to be formed by etching not only the interlayer insulating films 52 and 48 and the like but also the barrier film 50. However, the etching characteristic of the barrier film 50 of the aluminum oxide film or the like greatly differs from that of the interlayer insulating films 52 and 48 and the like, and therefore, it is extremely difficult to form such a contact hole without damaging the source/drain diffusion layer 14.

On the other hand, in this embodiment, the conductive plug 56 is connected to the source/drain diffusion layer 14 via the conductive plug 34, and therefore, the wiring 58 and the source/drain diffusion layer 14 can be electrically connected without damaging the source/drain diffusion layer 14. Therefore, according to this embodiment, a semiconductor device with high reliability can be manufactured with high yield.

Further, in this embodiment, the oxidation preventing film 28 is formed on the interlayer insulating film 26. Therefore, on the occasion of forming the silicon oxide film 30 and the like, oxidation of the surface of the conductive plug 34 can be prevented, and the contact resistance between the conductive plug 56 and the conductive plug 34 can be suppressed to be low.

Since in this embodiment, the surface of the bottom electrode film 36 is the Pt film 36b, a natural oxide film hardly occurs, and even if plasma cleaning is not performed after the contact hole 54 is formed, contact resistance hardly rises in this portion. Since the surface of the top electrode film 40 is the noble metal cap film 40c, a natural oxide film hardly occurs in this portion, and contact resistance hardly rises. Accordingly, plasma cleaning after formation of the contact hole 54 may be omitted. When plasma cleaning is omitted, the thickness of the noble metal cap film 40c does not decrease, and therefore, the noble metal cap film 40c does not need to be formed to be thick with the decrease taken into consideration. Accordingly, processing of the noble metal cap film 40c becomes easier. When the noble metal cap film 40c is not formed, and the $IrO_Y$ film 40b is exposed, the contact resistance of the top electrode rises by about three times unless plasma cleaning is performed.

Here, the thickness of the noble metal cap film 40c will be described. A certain oxygen permeability is required of the noble metal cap film 40c. This is for performing annealing treatment, for example, in an oxygen atmosphere at 600° C. to 800° C. for 30 minutes to 60 minutes for repairing a damage which occurs to the ferroelectric film 38 at the time of forming the top electrode. In the annealing treatment, in a small ferroelectric capacitor which constitutes the memory cell of a ferroelectric memory, oxygen penetrates into the ferroelectric film 38 from above and sides. Meanwhile, in a large ferroelectric capacitor such as a smoothing capacitor, penetration from the sides is insufficient, and therefore, penetration from above is important. Therefore, considering application to such a large ferroelectric capacitor, a certain fixed oxygen permeability is required of the noble metal cap film 40c. Furthermore, if the noble metal cap layer Ir film 42c is too thick, processing of it by etching sometimes becomes difficult.

Figure 3:
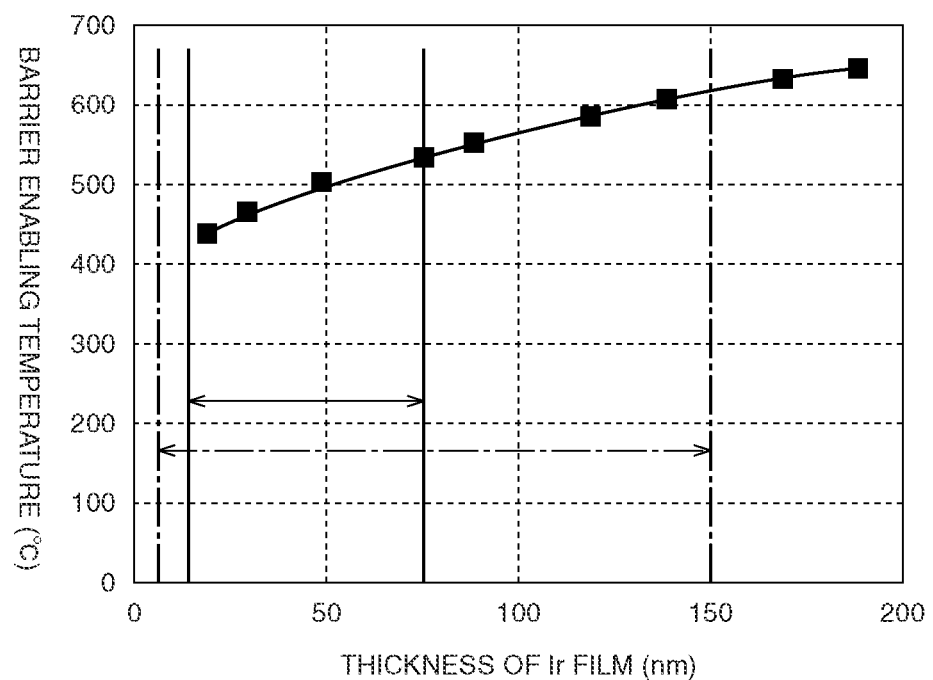
FIG. 3 is a graph showing relationship of a thickness of an Ir film and abnormal oxidation of a tungsten plug.

Thus, the inventor of the present application conducted a test about the relationship of the thickness of the Ir film and oxygen permeability. In the test, a tungsten plug was formed on a wafer, and an Ir film of a thickness of 20 nm to 190 nm was formed thereon. Next, annealing treatment was applied to the wafer for 30 minutes under an oxygen atmosphere at 400° C. to 700° C. Presence or absence of abnormal oxidation of the tungsten plug (projection state) was observed. The result is shown in FIG. 3. The horizontal axis of FIG. 3 represents the thickness of the Ir film. The vertical axis represents the temperature (temperature at which Ir barriers oxygen) of the upper limit at which abnormal oxidation does not occur to the tungsten plug.

As shown in FIG. 3, in the case of the thickness of 20 nm, the tungsten plug was not oxidized at 430° C. or less, but when the temperature exceeded 430° C., the tungsten plug was oxidized. On the other hand, in the case of the thickness of 190 nm, the tungsten plug was not oxidized even at 650° C. At 650° C., with the thickness of the Ir film of about 150 nm or more, the tungsten plug was not oxidized. Therefore, the thickness of the Ir film is preferably made 150 nm or less.

In the ferroelectric capacitor with the length of one side being 50 μm, for example, the switching charge amount in the case of the thickness of the noble metal cap film 40c of 200 nm is about 20% of the case of the thickness of the noble metal cap film 40c of 75 nm or less. This means that in the case of the thickness of 200 nm, the ferroelectric film 38 is recovered by only 20%. On the other hand, in the case of the noble metal cap film 40c of 75 nm or less, the switching charge amount is about the same as in the case without the noble metal cap film 40c irrespective of the size of the ferroelectric capacitor, and sufficient recovery can be said to be done. Accordingly, in order to cause oxygen to permeate sufficiently, the thickness of the noble metal cap film 40c is more preferably 75 nm or less. The noble metal cap films 40c composed of the other elements also have such a tendency.

When the noble metal cap film 40c is too thin on the other hand, the contact resistance rises and becomes unstable as in the conventional semiconductor device. Therefore, the thickness of the noble metal cap film 30c is preferably 5 nm or more. Especially when over-etching at the time of formation of a contact hole is considered, the thickness is preferably 15 nm or more. Specifically, the thickness of the noble metal cap film 40c is the most preferably 15 nm to 75 nm.

Further, the deposition temperature of the noble metal cap film 40c is preferably set at such a temperature that hardly causes internal stress. When the deposition temperature is 400° C. or lower, for example, stress in the compressing direction tends to act. When the deposition temperature is 500° C. or higher, stress in the tensile direction tends to act. Accordingly, the deposition temperature is preferably set at 400° C. to 500° C.

Instead of the wiring including the Al film, a Cu wiring may be formed by adopting, for example, a damascene method.

Instead of the titanium film 36a, as the Pt film adhesive layer, an aluminum oxide film of a thickness of 20 nm to 100 nm (for example, 20 nm) may be formed by, for example, a sputtering method or a CVD method.

Further, the thermal treatment after forming the ferroelectric film 38 may be performed in an atmosphere of mixture gas of argon and oxygen. In this case, for example, the thermal treatment temperature is set at 550° C. to 650° C. (for example, 550° C.), and the thermal treatment time is set at 30 seconds to 120 seconds (for example, 90 seconds).

Further, after the $IrO_X$ film 40a is formed and before the $IrO_Y$ film 40b is formed, thermal treatment may be performed in an atmosphere of mixture gas of argon and oxygen by an RTA method. In this case, for example, the thermal treatment temperature is set at 650° C. to 800° C., and the thermal treatment time is set at 10 seconds to 120 seconds. By the thermal treatment, the $IrO_X$ film 40a is completely crystallized, and the interface of the $IrO_X$ film 40a and the ferroelectric film 38 becomes more favorable.

Second Embodiment

Figure 4:
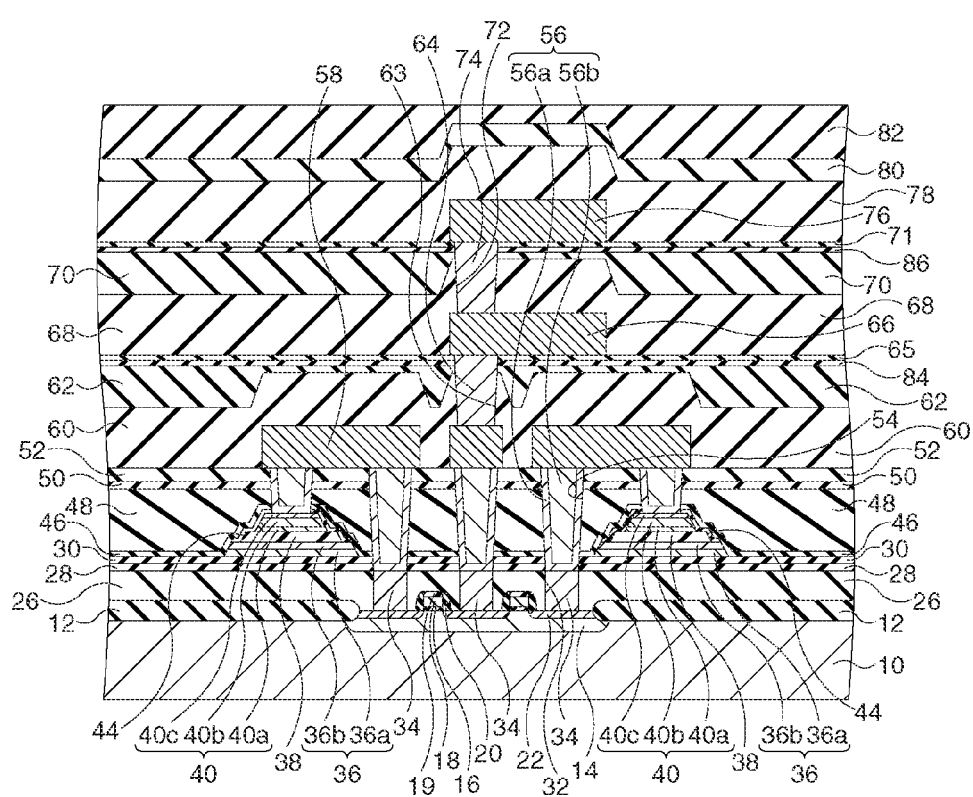
FIG. 4 is a sectional view showing a ferroelectric memory according to a second embodiment.

Next, a second embodiment will be described. FIG. 4 is a sectional view showing a ferroelectric memory (semiconductor device) according to the second embodiment.

In the second embodiment, a barrier film 84 is formed between the wiring (first metal wiring layer) 58 and the wiring (second metal wiring layer) 66, and a barrier film 86 is formed between the wiring (second metal wiring layer) 66 and a wiring (third metal wiring layer) 76. In other words, on the flattened silicon oxide film 62, the barrier film 84 and the silicon oxide film 65 are sequentially formed, and the wiring 66 is formed thereon. Further, on the flattened silicon oxide film 70, the barrier film 86 and the silicon oxide film 71 are sequentially formed, and the wiring 76 is formed thereon. The barrier films 84 and 86 are aluminum oxide films each of a thickness of 50 nm, for example. The thickness of each of the silicon oxide films 65 and 71 is, for example, 100 nm.

When the semiconductor device according to the second embodiment is manufactured, a series of process steps up to and including the flattening of the silicon oxide film 62 are performed as in the first embodiment, the barrier film 84 and the silicon oxide film 65 are sequentially formed. Thereafter, a series of process steps from the formation of the wiring 66 up to and including the flattening of the silicon oxide film 70 are performed. Next, the barrier film 86 and the silicon oxide film 71 are sequentially formed.

Thereafter, as in the first embodiment, the process steps from the formation of the wiring 76 up to and including the formation of the pad opening are performed, and the semiconductor device is completed.

According to such a second embodiment, a larger number of barrier films are formed, and therefore, a higher hydrogen barrier property can be obtained. Accordingly, yield can be enhanced more.

Accordingly, especially in the PTHS (Pressure Temperature Humidity Stress) test (JEDEC standards or the like) that is one of accelerated life tests, favorable test results can be obtained.

Third Embodiment

Next, a third embodiment will be described. In each of the first and the second embodiments, the structure of the ferroelectric capacitor 42 is of a planar type, but in the third embodiment, a ferroelectric capacitor of a stacked structure is provided. Hereinafter, the third embodiment will be described in detail, and its sectional structure will be described with its manufacturing method for convenience. FIGS. 5A to 5F are sectional views showing a method for manufacturing a ferroelectric memory (semiconductor device) according to the third embodiment in sequence of process steps.

Figure 5A:
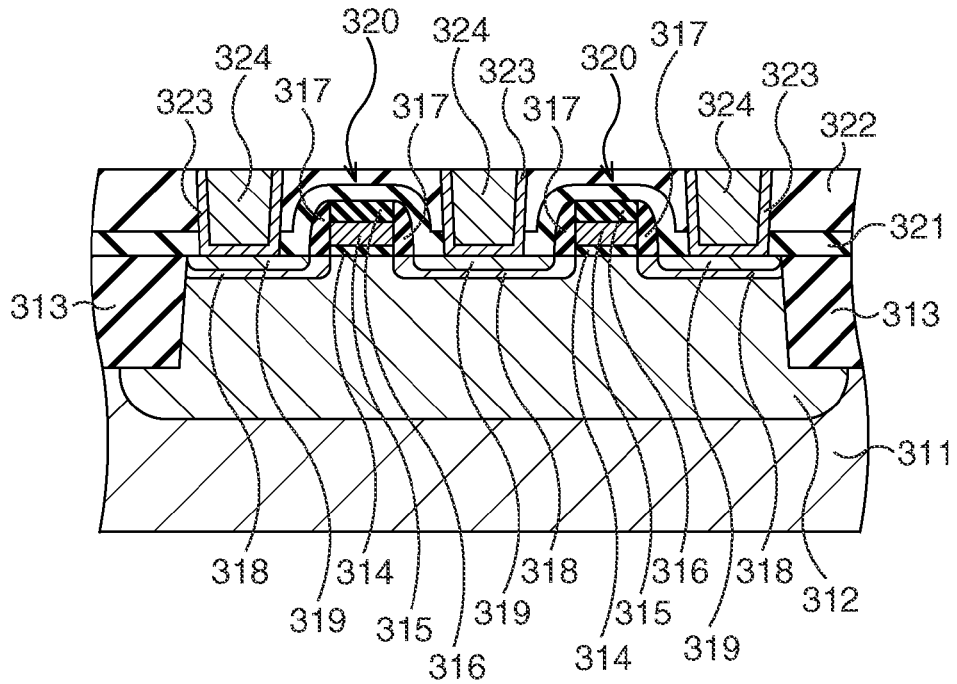
FIG. 5A is a sectional view showing a method for manufacturing a ferroelectric memory according to a third embodiment in sequence of process steps.

In this embodiment, as shown in FIG. 5A, a well 312 is first formed on a surface of a semiconductor substrate 311 such as a silicon substrate. An element isolation region 313 is formed on the surface of the semiconductor substrate 311 by, for example, STI (shallow trench isolation). Subsequently, a gate insulating film 314, a gate electrode 315, a cap film 316, a side wall 317, source/drain diffusion layers 318 and silicide layers 319 are formed on a surface of the well 312, and thereby, a MOS transistor 320 is formed as a switching element. The MOS transistor 320 corresponds to the MOS transistor 2 in FIG. 1. In each of the MOS transistors 320, two of the source/drain diffusion layers 318 are formed for a source and a drain, and one of them is shared by the two MOS transistors 320.

Next, a silicon oxynitride film 321 (thickness: 200 nm) is formed on the entire surface to cover the MOS transistors 320, a silicon oxide film 322 (thickness: 1000 nm) is further formed on the entire surface as an interlayer insulating film, and the silicon oxide film 322 is flattened by CMP (chemical mechanical polishing) or the like. The silicon oxynitride film 321 is formed to prevent hydrogen deterioration of the gate insulating film 314 and the like when the silicon oxide film 322 is formed. Thereafter, contact holes reaching the respective silicide layers 319 are formed in the silicon oxide film 322 and the silicon oxynitride film 321, and thereby, plug contact portions are opened. Subsequently, a glue film 323 is formed in the contact holes, and then, a W film is buried by, for example, a CVD method, and flattened by performing CMP, thereby conductive plugs 324 are formed.

Figure 5B:
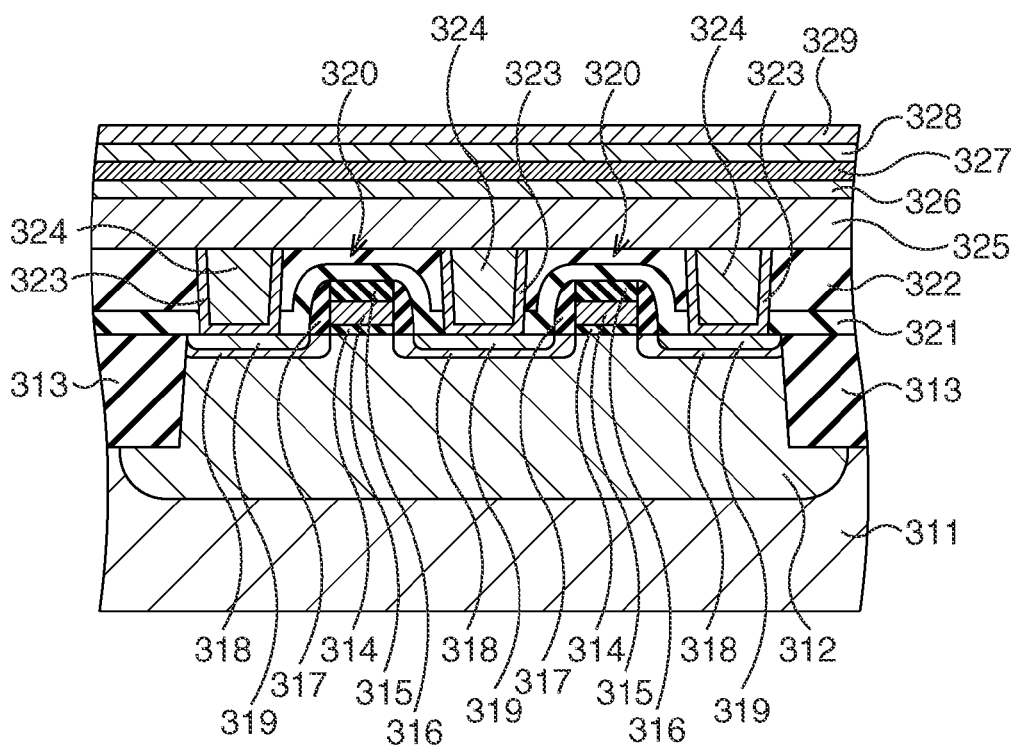
FIG. 5B is a sectional view showing the method for manufacturing a ferroelectric memory in sequence of process steps, following FIG. 5A.

Subsequently, as shown in FIG. 5B, an iridium film 325 is formed on the silicon oxide film 322 by, for example, a sputtering method. As the conditions at this time, for example, the substrate temperature is set at 500° C., the deposition power is set at 1 kW, the flow rate of Ar gas is set at 100 sccm, the pressure in the chamber is set at 0.35 Pa, and the deposition time is set at 176 seconds. As a result, the iridium film 325 of a thickness of about 250 nm is obtained.

Next, an iridium oxide film 326 is formed on the iridium film 325 by, for example, a sputtering method. As the conditions at this time, for example, the substrate temperature is set at 50° C., the deposition power is set at 1 kW, the flow rate of Ar gas is set at 60 sccm, the flow rate of $O_2$ gas is set at 60 sccm, the pressure in the chamber is set at 0.37 Pa, and the deposition time is set at 10 seconds. As a result, the iridium oxide film 326 of a thickness of about 28 nm is obtained.

Next, a platinum film 327 is formed on the iridium oxide film 326 by, for example, a sputtering method. As the conditions at this time, for example, the substrate temperature is set at 350° C., the deposition power is set at 1 kW, the flow rate of Ar gas is set at 100 sccm, the pressure in the chamber is set at 0.38 Pa, and the deposition time is set at 8 seconds. As a result, the platinum film 327 of a thickness of about 15 nm is obtained.

Thereafter, a platinum oxide film 328 is formed on the platinum film 327 by, for example, a sputtering method. As the conditions at this time, for example, the substrate temperature is set at 350° C., the deposition power is set at 1 kW, the flow rate of Ar gas is set at 36 sccm, the flow rate of $O_2$ gas is set at 144 sccm, the pressure in the chamber is set at 6.2 Pa, and the deposition time is set at 22 seconds. As a result, the platinum oxide film 328 of a thickness of about 25 nm is formed. Subsequently, a platinum film 329 is formed on the platinum oxide film 328 by, for example, a sputtering method. As the conditions at this time, for example, the substrate temperature is set at 100° C., the deposition power is set at 1 kW, the flow rate of Ar gas is set at 100 sccm, the pressure in the chamber is set at 0.4 Pa, and the deposition time is set at 32 seconds. As a result, the platinum film 329 of a thickness of about 50 nm is formed.

The iridium film 325, iridium oxide film 326, platinum film 327, platinum oxide film 328 and platinum film 329 constitute a barrier metal film and a bottom electrode film. As the barrier metal film and the bottom electrode film, the following multi-layered bodies may be used. For example, (a) a multi-layered body in which an Ir film is formed on a Ti film, (b) a multi-layered body in which a Ti film and an Ir film are sequentially formed on a TiAlN film, (c) a multi-layered body in which a Pt film is formed on a Ti film, (d) a multi-layered body in which a Pt film is formed on an $IrO_2$ film, (e) a multi-layered body in which a Pt film is formed on an $RuO_2$ film, (f) a multi-layered body in which a Pt film is formed on an LSCO ($La_{0.5}Sr_{0.5}CuO_3$) film, (g) a multi-layered body in which a Ti film and a Pt film are sequentially formed on a TiAlN film, and the like may be used. Specifically, single films and stacked conductive films of metal or metal oxide including at least one kind selected from a group constituted of Pt, Ir, Ru, Rh, Re, Os, Pd, $SrRuO_3$ and TiAlN can be used.

Figure 5C:
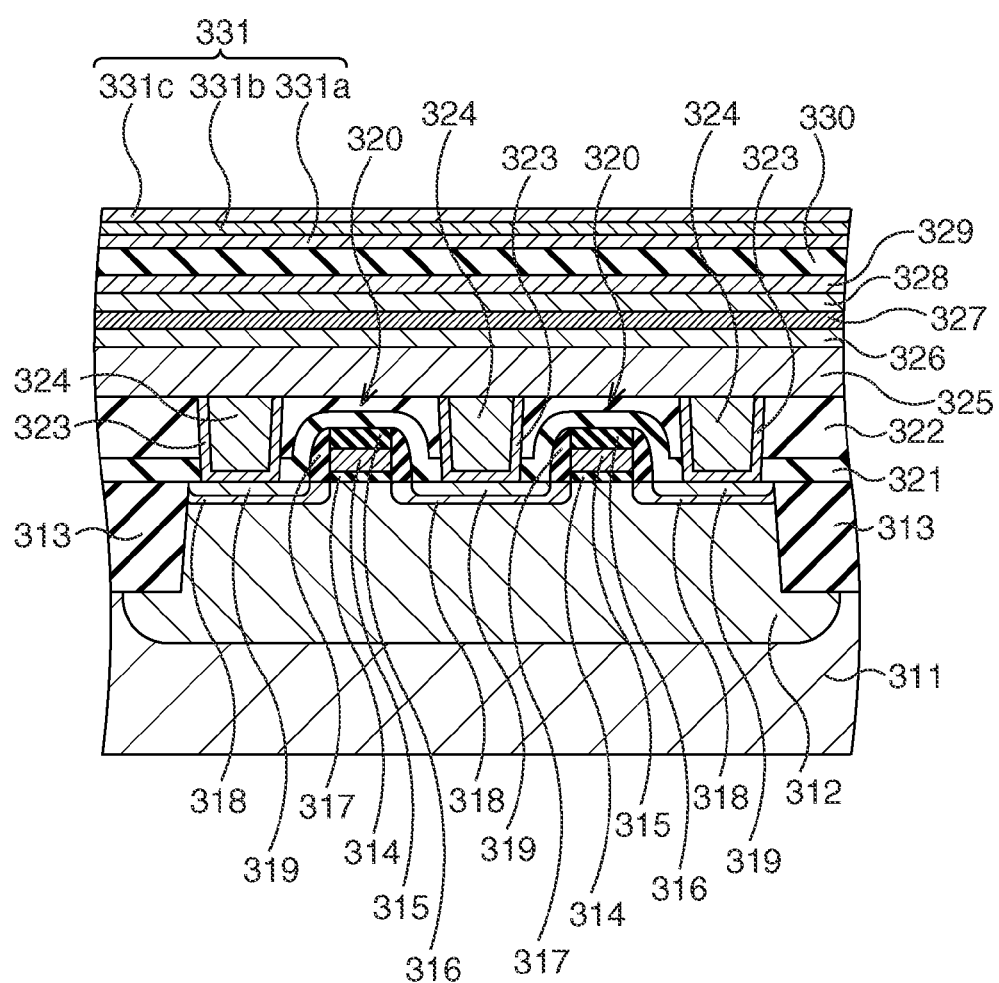
FIG. 5C is a sectional view showing the method for manufacturing a ferroelectric memory in sequence of process steps, following FIG. 5B.

After the above described multi-layered body is formed, the platinum film 329 is crystallized by performing rapid thermal annealing (RTA) at, for example, 750° C. under an Ar atmosphere for 60 seconds. Next, as shown in FIG. 5C, a ferroelectric film, for example, a PLZT((Pb, La) (Zr, Ti)$O_3$) film 330 is formed on the platinum film 329 by, for example, a sputtering method, and crystallization annealing for it is performed. The PLZT film 330 can be formed by, for example, an MOCVD method, and in the case of using the MOCVD method, the constitution of the bottom electrode film is desirably changed to another one.

After the crystallization annealing, a top electrode film 331 is formed on the PLZT film 330 by sputtering. The top electrode film 331 is constituted of, for example, two layers of iridium oxide films differing in composition from each other, and a noble metal cap film. In formation of the iridium oxide film 331a of the first layer, for example, the substrate temperature is set at a room temperature, the deposition power is set at 2 kW, the flow rate of Ar gas is set at 100 sccm, and the flow rate of $O_2$ gas is set at 59 sccm. The iridium oxide film 331a is grown to, for example, about 50 nm. After the iridium oxide film 331a is formed, annealing is performed, and thereafter, an iridium oxide film 331b of the second layer is formed. The iridium oxide film 331b is grown to, for example, about 75 to 125 nm. Subsequently, a noble metal cap film 331c is formed on the iridium oxide film 331b by, for example, a sputtering method. As the conditions at this time, for example, the substrate temperature is set at 425° C. or higher, the deposition power is set at 1 kW, the flow rate of Ar gas is set at 100 sccm, and the deposition time is set at 21 seconds. As a result, the noble metal cap film 331c of a thickness of about 30 nm is formed. Subsequently, cleaning of the rear surface (back surface) of the semiconductor substrate (wafer) 311 is performed.

Next, a titanium nitride film (not shown) and a silicon oxide film (not shown) using TEOS which are used as a hard mask when the top electrode film 331, the PLZT film 330, the platinum film 329, the platinum oxide film 328, the platinum film 327, the iridium oxide film 326 and the iridium film 325 are patterned are formed in sequence. The titanium nitride film is formed at, for example, 200° C., and its thickness is about 200 nm. The silicon oxide film is formed at, for example, 390° C., and its thickness is about 390 nm.

Figure 5D:
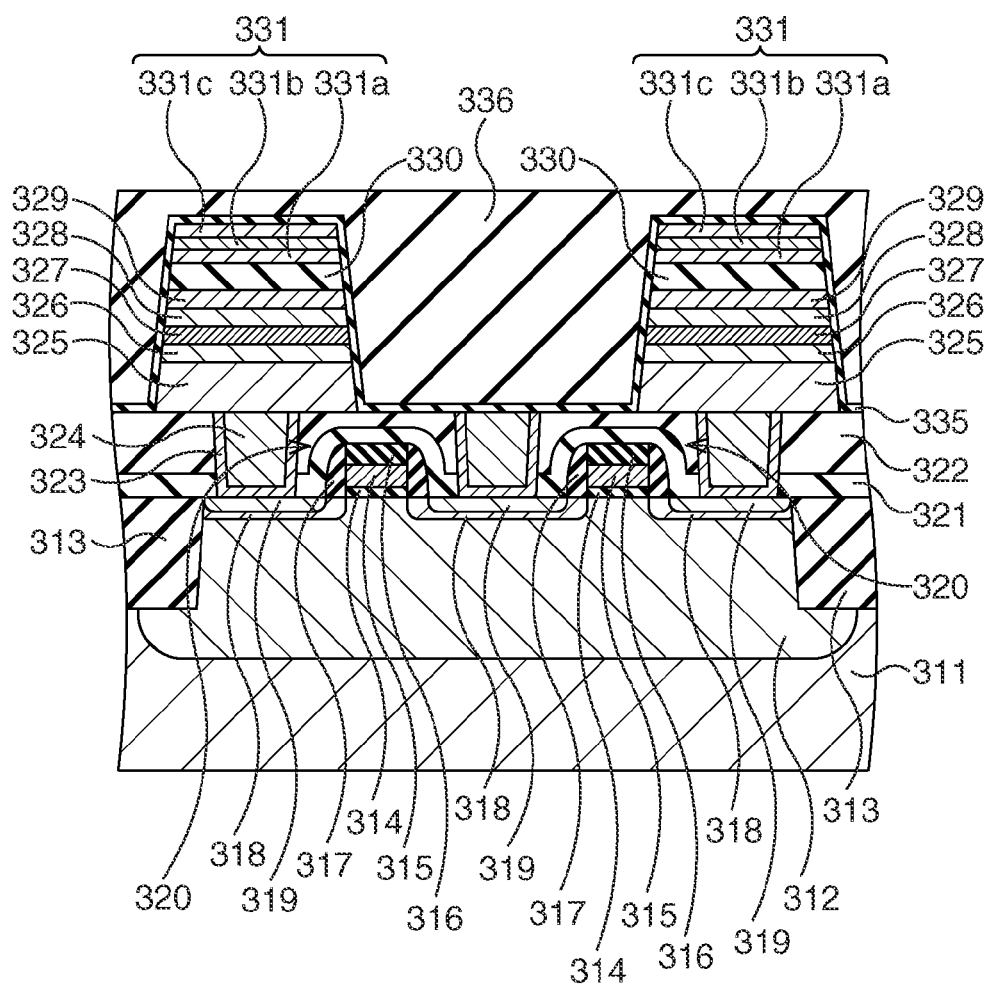
FIG. 5D is a sectional view showing the method for manufacturing a ferroelectric memory in sequence of process steps, following FIG. 5C.

Next, by patterning the silicon oxide film and the titanium nitride film, a hard mask is formed in only a region where a stacked type ferroelectric capacitor is to be formed. Next, by using a patterning and etching techniques using the silicon oxide film and the titanium nitride film as the hard mask, the top electrode film 331, the PLZT film 330, the platinum film 329, the platinum oxide film 328, the platinum film 327, the iridium oxide film 326 and the iridium film 325 are collectively processed, and thereby, the ferroelectric capacitor of a stacked structure is formed as shown in FIG. 5D. The ferroelectric capacitor corresponds to the ferroelectric capacitor 1 in FIG. 1. Thereafter, the hard mask (the silicon oxide film and the titanium nitride film) is removed. Subsequently, thermal treatment at, for example, 300° C. to 500° C. for 30 minutes to 120 minutes is performed in an oxygen atmosphere.

Next, a barrier film 335 is formed on the entire surface by, for example, a sputtering method or a CVD method. As the barrier film 335, an aluminum oxide film of a thickness of 50 nm is formed by, for example, a sputtering method or a CVD method. Subsequently, in order to repair damage to the PLZT film 330 by deposition, the etching process and the like, recovery annealing is performed. Thermal treatment at 500° C. to 700° C. for 30 minutes to 120 minutes is performed in, for example, an oxygen atmosphere.

Next, an interlayer insulating film 336 constituted of a silicon oxide of a thickness of 1500 nm, for example, is formed on the entire surface by, for example, a plasma TEOSCVD method. When the silicon oxide film is formed as the interlayer insulating film 336, mixture gas of, for example, TEOS gas, oxygen gas and helium gas is used as a source gas. As the interlayer insulating film 336, for example, an inorganic film or the like having insulation properties may be formed. After the interlayer insulating film 336 is formed, the surface of the interlayer insulating film 336 is flattened by, for example, a CMP method.

Next, thermal treatment is performed in a plasma atmosphere generated by using $N_2O$ gas, $N_2$ gas or the like. As a result of the thermal treatment, moisture in the interlayer insulating film 336 is removed, the property of the interlayer insulating film 336 changes, and it becomes difficult for moisture to enter in the interlayer insulating film 336.

Figure 5E:
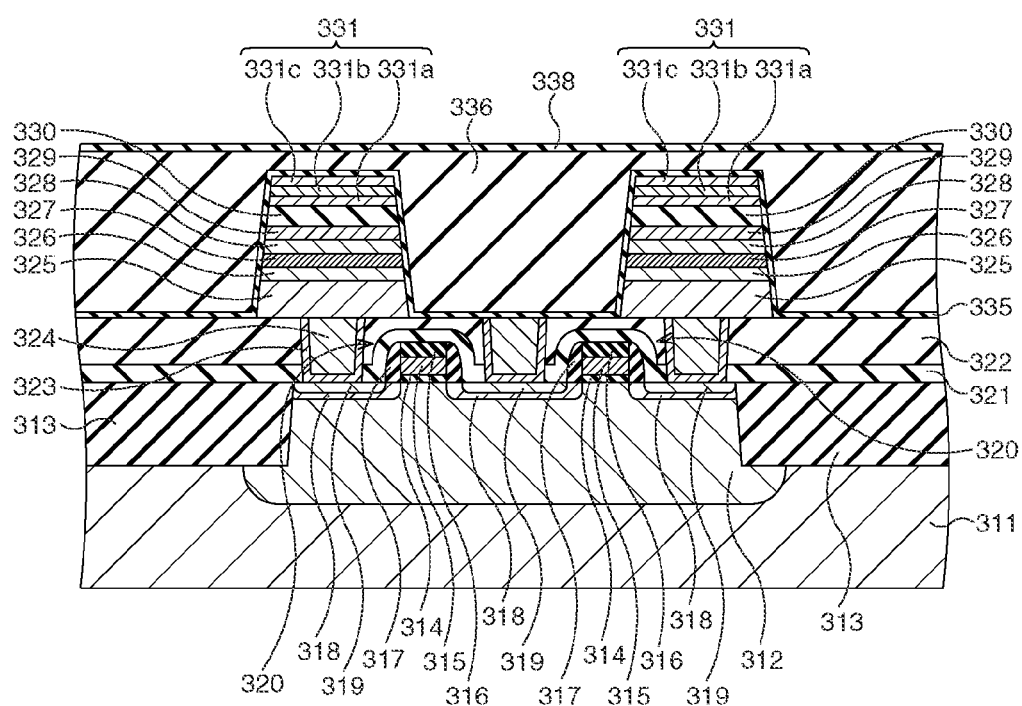
FIG. 5E is a sectional view showing the method for manufacturing a ferroelectric memory in sequence of process steps, following FIG. 5D.
Figure 6:
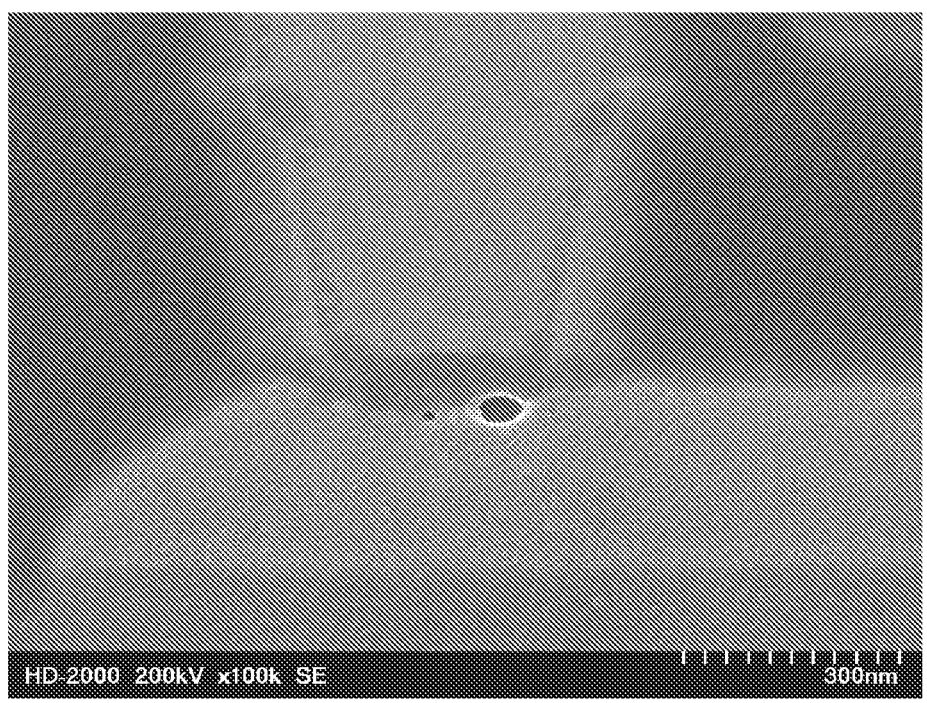
FIG. 6 is an electron microscope photograph showing a void between a top electrode and a plug.

Thereafter, as shown in FIG. 5E, a barrier film 338 is formed on the entire surface by, for example, a sputtering method or a CVD method. As the barrier film 338, an aluminum oxide film of a thickness of 50 nm to 100 nm, for example, is formed. The barrier film 338 is formed on the flattened interlayer insulating film 336, and therefore, the barrier film 338 becomes flat.

Next, as shown in FIG. 5F, an interlayer insulating film 339 is formed on the entire surface by, for example, a plasma TEOSCVD method. As the interlayer insulating film 339, a silicon oxide film of a thickness of 800 nm to 1000 nm, for example, is formed. As the interlayer insulating film 339, an SiON film, a silicon nitride film or the like may be formed. Next, the surface of the interlayer insulating film 339 is flattened by, for example, a CMP method.

Thereafter, a contact hole reaching the conductive plug 324 is formed in the interlayer insulating film 339, the barrier film 338, the interlayer insulating film 336 and the barrier film 335 by using a patterning and etching techniques.

Thereafter, the conductive plug 56 and the wiring 58 are formed as the formation of the conductive plug 56 in the first embodiment. Subsequently, as in the second embodiment, the process steps from formation of the silicon oxide film 60 up to and including the formation of the pad opening are performed, and the semiconductor device is completed. The wiring 56 connected to the ferroelectric capacitor is connected to the plate line, and the wiring connected to the MOS transistor 320 via the conductive plug 56 is connected to the bit line.

In the embodiment applied to such a stacked type ferroelectric capacitor, contact resistance can be stabilized and a damage to the ferroelectric film 330 can be sufficiently repaired as in the first embodiment and the like. Accordingly, the yield is enhanced and the service life under severer conditions is increased.

In the present embodiment, the barrier film is not limited to the aluminum oxide film and the titanium oxide film, but may be any film that can prevent diffusion of at least hydrogen or water such as a metal oxide film, a metal nitride film and the like. For example, an Al nitride film, an Al oxynitride film, a Ta oxide film, a Ta nitride film and a Zr oxide film, an Si oxynitride film and the like can be used. A metal oxide film is closely packed, and therefore, even when it is relatively thin, it can reliably prevent diffusion of hydrogen. Accordingly, from the viewpoint of microfabrication, a metal oxide is preferably used as the barrier film.

The crystal structure of the substance constituting the ferroelectric film is not limited to a perovskite structure, but may be, for example, a Bi layer structure. The composition of the substances composing the ferroelectric film is not specially limited. For example, as an acceptor element, Pb (lead), Sr (strontium), Ca (calcium), Bi (bismuth), Ba (barium), Li (lithium) and/or Y (yttrium) may be contained, and as a donor element, Ti (titanium), Zr (zirconium), Hf (hafnium), V (vanadium), Ta (tantalum), W (tungsten), Mn (manganese), Al (aluminum), Bi (bismuth) and/or Sr (strontium) may be contained.

As the chemical formula of the substance composing the ferroelectric film, for example, Pb (Zr, Ti) $O_{3r}$, (Pb, Ca) (Zr, Ti) $O_3$, (Pb, Ca) (Zr, Ti, Ta) $O_3$, (Pb, Ca) (Zr, Ti, W) $O_3$, (Pb, Sr) (Zr, Ti) $O_3$, (Pb, Sr) (Zr, Ti, W) $O_3$, (Pb, Sr) (Zr, Ti, Ta) $O_3$, (Pb, Ca, Sr) (Zr, Ti) $O_3$, (Pb, Ca, Sr) (Zr, Ti, W) $O_3$, (Pb, Ca, Sr) (Zr, Ti, Ta) $O_3$, $SrBi_2$ $(Ta_xNb_{1-x})_2O_8$, $SrBi_2Ta_2O_9$, $Bi_4Ti_2O_{12}$, $Bi_4Ti_3O_9$ and $BaBi_2Ta_2O_9$ are cited, but it is not limited to them. Si may be added to them.

Further, the present embodiment is not limited to the application to the ferroelectric memory, but, may be applied to, for example, a DRAM and the like. When it is applied to a DRAM, a high dielectric constant film such as, for example, a (BaSr)$TiO_3$ film (BST film), an $SrTiO_3$ film (STO film), and a $Ta_2O_5$ film may be used. The high dielectric constant film is a dielectric film which has a relative dielectric constant higher than silicon dioxide.

Further, the compositions of the top electrode and the bottom electrode are not specially limited. The bottom electrode may be composed of, for example, Pt (platinum), Ir (Iridium), Ru (ruthenium), Rh (rhodium), Re (rhenium), Os (osmium) and/or Pd (palladium), or it may be composed of an oxide of them. The layer of the top electrode which is lower from the noble metal cap film may be composed of an oxide of, for example, Pt, Ir, Ru, Rh, Re, Os and/or Pd. The top electrode may be constituted by stacking a plurality of films.

Further, the structure of the cell of the ferroelectric memory is not limited to a 1T1C type, but it may be of a 2T2C type. In the ferroelectric memory, the ferroelectric capacitor itself may be constituted to be used as both a storage part and a switching part. In this case, the structure in which a ferroelectric capacitor is formed instead of a gate electrode of a MOS transistor is adopted. In other words, a ferroelectric capacitor is formed on a semiconductor substrate via a gate insulating film.

Further, a method for forming the ferroelectric capacitor is not specially limited. For example, a sol-gel method, a metallo-organic decomposition method (MOD), a CSD (Chemical Solution Deposition) method, a chemical vapor deposition (CVD) method, an epitaxial growth method, a sputtering method, a MOCVD (Metal Organic Chemical Vapor Deposition) method and so on can be adopted.

INDUSTRIAL APPLICABILITY

As described above in detail, according to the present invention, contact resistance between the ferroelectric capacitor and the wiring can be stabilized without degrading the characteristics of the ferroelectric capacitor.

What is claimed is:

1. A method for manufacturing a semiconductor device, comprising:
    forming a ferroelectric capacitor including a bottom electrode, a ferroelectric film and a top electrode, over a semiconductor substrate;
    forming an interlayer insulating film covering the ferroelectric capacitor; forming a contact hole reaching the top electrode in the interlayer insulating film; and
    forming a wiring electrically connected to the top electrode through the contact hole on the interlayer insulating film,
    wherein forming the top electrode comprises:
    forming a first conductive oxide film having a first composition ratio of oxygen;
    forming a second conductive oxide film on the first conductive oxide film, a second composition ratio of oxygen of the second conductive oxide film being higher than the first composition ratio of oxygen; and
    forming a cap film composed of a noble metal having less catalytic action than Pt (platinum) and having a thickness of 150 nm or less on the second conductive oxide film.

2. The method for manufacturing a semiconductor device according to claim 1, wherein as the cap film, one kind of film selected from a group consisting of an iridium film, a ruthenium film, a rhodium film and a palladium film is formed.

3. The method for manufacturing a semiconductor device according to claim 1, further comprising forming a conductive plug containing tungsten in the contact hole.

4. The method for manufacturing a semiconductor device according to claim 3, wherein forming the conductive plug comprises forming a glue film containing titanium or tantalum along an inner surface of the contact hole.

5. The method for manufacturing a semiconductor device according to claim 1, wherein a thickness of the cap film is made 75 nm or less.

6. The method for manufacturing a semiconductor device according to claim 1, wherein a thickness of the cap film is made 5 nm or more.

7. The method for manufacturing a semiconductor device according to claim 1, wherein a thickness of the cap film is made 15 nm or more.

8. The method for manufacturing a semiconductor device according to claim 1, wherein the wiring is formed in a plurality of wiring layers, the method, further comprising forming a barrier film preventing diffusion of hydrogen or water in a position at a height of one or more of the wiring layers.

9. The method for manufacturing a semiconductor device according to claim 2, wherein on an occasion of forming the cap film, a temperature of the semiconductor substrate is set at 400° C. to 500° C.

10. The method for manufacturing a semiconductor device according to claim 1, wherein forming the ferroelectric capacitor comprises, after the first conductive oxide film is formed and before the second conductive oxide film is formed, performing annealing treatment of the first conductive oxide film and the ferroelectric film in an atmosphere containing oxygen.

* * * * *